United States Patent
Rawat et al.

(10) Patent No.: US 12,068,026 B2
(45) Date of Patent: Aug. 20, 2024

(54) LOW POWER AND FAST MEMORY RESET

(71) Applicant: STMicroelectronics International N.V., Geneva (CH)

(72) Inventors: Harsh Rawat, Haryana (IN); Praveen Kumar Verma, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 168 days.

(21) Appl. No.: 17/852,677

(22) Filed: Jun. 29, 2022

(65) Prior Publication Data

US 2023/0015002 A1 Jan. 19, 2023

Related U.S. Application Data

(60) Provisional application No. 63/221,090, filed on Jul. 13, 2021.

(51) Int. Cl.
*G11C 11/419* (2006.01)
*G11C 11/412* (2006.01)

(52) U.S. Cl.
CPC .......... *G11C 11/419* (2013.01); *G11C 11/412* (2013.01)

(58) Field of Classification Search
CPC ....... G11C 11/419; G11C 11/412; G11C 7/20; G11C 5/147; G11C 7/12; G11C 8/08; G11C 11/418
See application file for complete search history.

(56) References Cited

U.S. PATENT DOCUMENTS

| | | | |
|---|---|---|---|
| 7,333,380 B2 | 2/2008 | Schoellkopf | |
| 8,885,429 B1* | 11/2014 | Van Winkelhoff | G11C 29/52 365/218 |
| 9,608,827 B1* | 3/2017 | Trimberger | G11C 7/12 |
| 10,438,025 B2* | 10/2019 | Lu | G06F 21/79 |
| 2003/0231538 A1 | 12/2003 | Rimondi et al. | |
| 2006/0233015 A1 | 10/2006 | Schoellkopf | |
| 2019/0172526 A1* | 6/2019 | Noel | G11C 11/412 |

* cited by examiner

*Primary Examiner* — Ajay Ojha
(74) *Attorney, Agent, or Firm* — Crowe & Dunlevy LLC

(57) ABSTRACT

A method of memory reset includes precharging bit lines of a memory array, asserting a signal at a reset node to remove the precharge voltage, and selecting write drivers associated with the bit lines associated with columns of the memory array that contain memory cells to be reset, with the assertion of the signal at the reset node also resulting in application of desired logic states to inputs of the selected write drivers to cause those selected write drivers to change a logic state of the bit lines associated with those write drivers. The method continues with asserting each word line associated with a row of the memory that contains memory cells to be reset to write desired logic states to all of the memory cells of the columns and rows of the memory to be reset during a single clock cycle, and then deasserting those word lines.

20 Claims, 17 Drawing Sheets

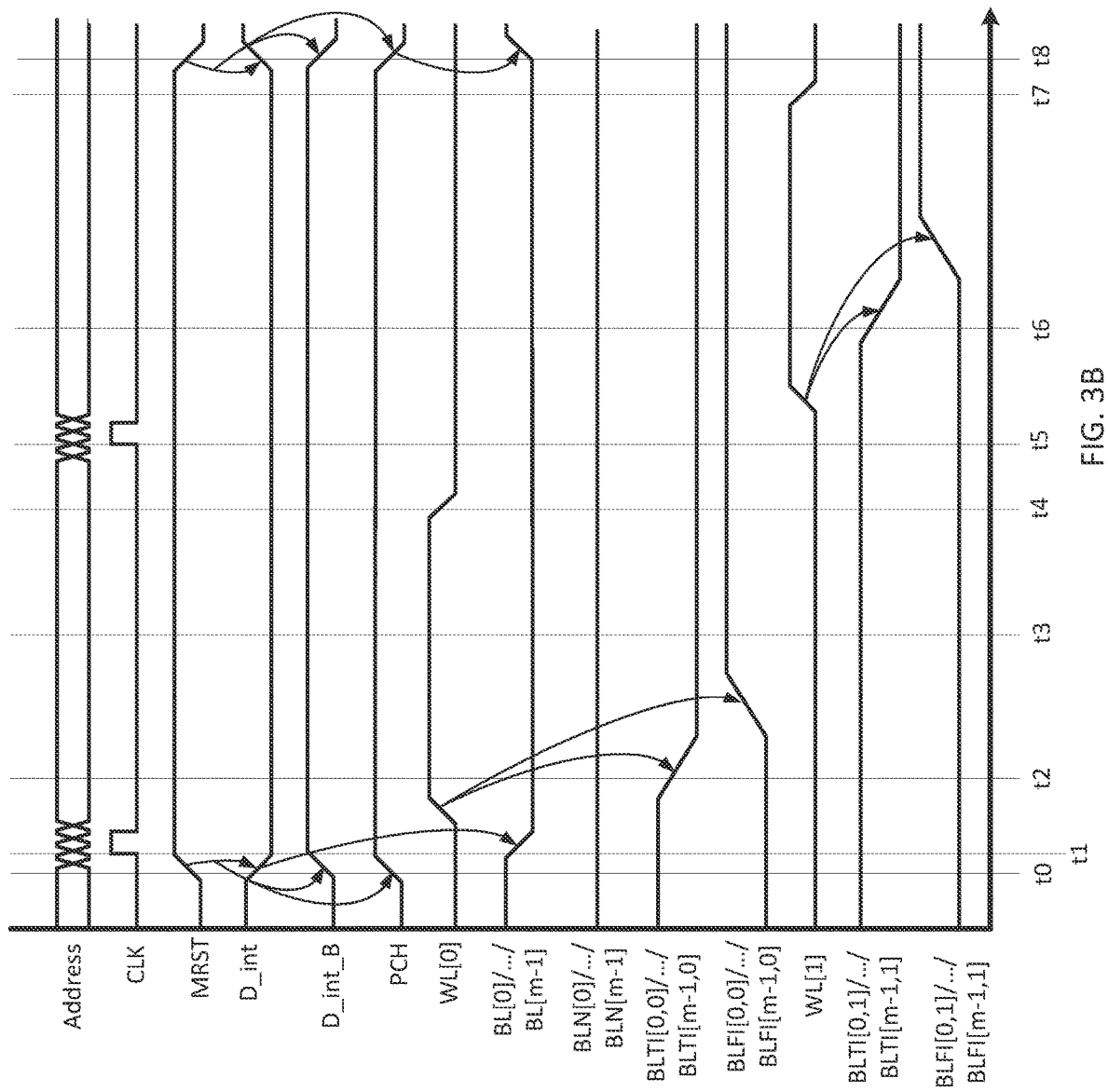

LOW POWER AND FAST MEMORY RESET

CROSS REFERENCE TO RELATED APPLICATIONS

This application claims priority from U.S. Provisional Application for Patent No. 63/221,090, filed Jul. 13, 2021, the disclosure of which is incorporated herein by reference.

TECHNICAL FIELD

This disclosure related to the field of static random access memories (SRAMs) and, in particular, to techniques for performing fast resets of SRAMs while reducing power consumption for those processes.

BACKGROUND

Static random access memory (SRAM) is used in many electronic devices in the modern world. Certain applications that utilize SRAM memory, such as time-of-flight (ToF) ranging and Light Detection and Ranging (LiDAR) applications, involve the frequent "reset" of the SRAM memory, which is to say the writing of the same logical value (such as a logic 0 as default, or as an alternative a logic 1, or a predefined pattern of logic 1s and logic 0s such as a checker board) to all memory cells of at least a portion of the SRAM.

Reference is now made to FIG. 1 which shows a block diagram of a memory circuit 10 for use in HistoRam (memory used in the building of histograms for ranging applications). The circuit 10 includes an array 12 of memory cells C arranged in rows and columns. The array 12 has a size of m×n, with m being the number of columns and n being the number of rows. The memory cells in each row are controlled by a word line from among word lines 14[0], . . . , 14[n-1]. The memory cells in each column are connected to a bit line/complementary bit line pair from among pairs 16[0], . . . , 16[m-1]. A row decoder circuit 18b receives a row address that is predecoded from an address and decodes the bits of the row address to select and actuate one of the word lines 14[0], . . . , 14[n-1]. A column decoder circuit 18a receives a column address that is predecoded from the address and decodes the bits of the column address to select a plurality of the bit lines 16[0], . . . , 16[m-1]. In read mode, data stored in the memory cells which are located at the intersections of the one of the word lines 14[0], . . . , 14[n-1] and the plurality of bit lines 16[0], . . . , 16[m-1] selected by the address is read out to the data input/output lines 20. In write mode, data on the data input/output lines 20 is written to the memory cells which are located at the intersections of the one of the word lines 14[0], . . . , 14[n-1] and the plurality of bit lines 16[0], . . . , 16[m-1] selected by the address.

The write operation will be discussed more in detail, since this disclosure focuses on the write operation. In particular, note that at the end of every operation, the precharge circuit 24 precharges the bit line pairs 16[0], . . . , 16[m-1] to a voltage that is between the voltage representing a logic 0 and the voltage representing a logic 1. Therefore, at the beginning of a write operation, the selected bit line pairs 16[0], . . . , 16[m-1] are already precharged. Thus, the precharge voltage applied by the precharge circuit 24 to the selected bit line pairs 16[0], . . . , 16[m-1] is released, allowing the selected bit line pairs 16[0], . . . , 16[m-1] to float. Then, the selected word line 14[0], . . . , 14[n-1] is selected by the row decoder circuitry 18b asserting the associated word line 14[0], . . . , 14[n-1], and the write driver 22 forces the selected memory cells to the desired logic value. To complete the write operation, the precharge of the selected bit line pairs 16[0], . . . , 16[m-1] is reinstated, readying the associate memory cells for the next operation, whether it be a write operation or a read operation.

Conventionally, memory cells of the array 12 are selected one word at a time for a write operation. Conventionally, to reset a portion or all of the memory cells of the array 12, a write operation is performed for each selected word to write logic zeroes into the memory cells of that word. Conventionally, one clock cycle is used for each write operation to be performed. Therefore, the number of clock cycles used to reset a given number of words is equal to the given number of words (e.g., if ten words are to be reset, ten clock cycles are used to write logic zeroes to the memory cells of each word). While the write cycle times for modern SRAM memory are relatively short, for certain applications such as ToF and LiDAR, it is desired for large blocks of SRAM to be reset as quickly as possible, and even modern SRAM memory cannot perform this as quickly as desired due to the large number of clock cycles that may be involved.

Still further, note that each write operation performed (and one is performed per word to be reset) involves the discharging of the ones of that bit line pair followed by a precharge of that bit line pair, consuming power for each memory cell of each word to be reset. Even further, as can be observed in FIG. 1, it is common for a separate reset data input pin "D" to be present in HistoRam (or conventional SRAM with an existing D input) so that the selected reset value (logic 0 or logic 1) can be directly provided for writing to the words to be reset, resulting in area consumption for the pin and the associated routing.

As a consequence, further development into circuitry and techniques for operating said circuitry to provide for a fast, low-power consumption memory reset is needed.

SUMMARY

Disclosed herein is a method of resetting a memory, including: a) precharging bit lines of a memory array by applying a precharge voltage to the bit lines; b) asserting a signal at a reset node to thereby remove the precharge voltage from the bit lines; c) selecting write drivers associated with the bit lines associated with columns of the memory array that contain memory cells to be reset; wherein the assertion of the signal at the reset node also results in assertion of inputs of the selected write drivers, thereby causing those selected write drivers to change a logic state of the bit lines associated with those write drivers; d) asserting a word line associated with a row of the memory that contains memory cells to be reset, thereby writing desired logic states to all of the memory cells of the columns and row of the memory to be reset during a first clock cycle, and then deasserting that word line; and e) without first reapplying the precharge voltage to the bit lines and the complementary bit lines, asserting a word line associated with another row of the memory that contains memory cells to be reset, thereby writing the desired logic states to all of the memory cells of the columns and the other row of the memory to be reset during a second clock cycle, and then deasserting that word line.

The method may also include: f) repeating step e) until each row containing memory cells to be reset has had those memory cells reset.

The method may also include: g) deasserting the signal at the reset node; and h) reapplying the precharge voltage to the bit lines.

All columns may contain memory cells to be reset, and at c), all write drivers associated with the bit lines may be selected.

Less than all columns may contain memory cells to be reset, and at c), less than all write driver associated with the bit lines may be selected.

The assertion of the signal at the reset node may result in assertion of the inputs of the selected write drivers, thereby causing those selected write drivers to pull the bit lines associated with those write drivers to a logic low. The desired logic states written to all of the memory cells of the columns and the row of the memory to be reset may be logic 0s. The desired logic states written to all of the memory cells of the columns and the other row of the memory to be reset may be logic 0s.

The assertion of the signal at the reset node may result in application of desired logic signals to the inputs of the selected write drivers, thereby causing those selected write drivers to drive the bit lines associated with those drivers to desired logic states. The desired logic states written to all of the memory cells of the columns and the row of the memory to be reset may represent a predefined pattern. The desired logic states written to all of the memory cells of the columns and the other row of the memory to be reset may represent the predefined pattern.

The predefined pattern may be a checkerboard pattern.

The assertion of the signal at the reset node may result in assertion of the inputs of the selected write drivers, thereby causing those selected write drivers to pull the bit lines associated with those write drivers to a logic high. The desired logic states written to all of the memory cells of the columns and the row of the memory to be reset may be logic 1s. The desired logic states written to all of the memory cells of the columns and the other row of the memory to be reset may be logic 1s.

Assertion of the word line associated with the row of the memory that contains the memory cells to be reset may result in writing a same logic state to all of the memory cells of the columns and row of the memory to be reset during the first clock cycle, and then deasserting that word line.

Also disclosed herein is a method of resetting a memory, including: a) precharging bit lines of a memory array by applying a precharge voltage to the bit lines; b) asserting a signal at a reset node to thereby remove the precharge voltage from the bit lines; c) selecting write drivers associated with the bit lines associated with columns of the memory array that contain memory cells to be reset; wherein the assertion of the signal at the reset node also results in application of desired logic states to inputs of the selected write drivers, thereby causing those selected write drivers to change a logic state of the bit lines associated with those write drivers; and d) asserting each word line associated with a row of the memory that contains memory cells to be reset, thereby writing the desired logic states to all of the memory cells of the columns and rows of the memory to be reset during a single clock cycle, and then deasserting those word lines.

The method may further include: g) deasserting the signal at the reset node; and h) reapplying the precharge voltage to the bit lines.

All columns may contain memory cells to be reset, and at c), all write drivers associated with the bit lines may be selected.

Less than all columns may contain memory cells to be reset, and at c), less than all write driver associated with the bit lines may be selected.

Assertion of the signal at the reset node may result in assertion of the inputs to the selected write drivers, thereby causing those selected write drivers to pull the bit lines associated with those write drivers to a logic low. The desired logic states written to all of the memory cells of the columns and rows of the memory to be reset may be logic 0s.

The assertion of the signal at the reset node may result in application of desired logic signals to the inputs of the selected write drivers, thereby causing those selected write drivers to drive the bit lines associated with those drivers to desired logic states. The desired logic states written to all of the memory cells of the columns and the rows of the memory to be reset may represent a predefined pattern.

The predefined pattern may be a checkerboard pattern.

Assertion of the signal at the reset node may result in assertion of the inputs to the selected write drivers, thereby causing those selected write drivers to drive the bit lines associated with those write drivers to a logic high. The desired logic states written to all of the memory cells of the columns and rows of the memory to be reset may be logic 1s.

Also disclosed herein is a static random access memory (SRAM) device, including: a memory array being formed of memory cells and being organized into rows and columns, with each row having a word line associated therewith and each column having a bit line and complementary bit line associated therewith; a row decoder configured to selectively assert word lines of desired rows; a column decoder configured to select desired columns; precharge circuitry associated with the bit lines and complementary bit lines; column driving circuitry configured to selectively drive the bit lines and the complementary bit lines of the desired columns to opposite logic states. In response to assertion of a reset signal: the precharge circuitry is configured to release a precharge voltage applied to the bit lines and complementary bit lines; the row decoder is configured to assert the word lines of each desired row for a given period of time sufficient to permit resetting of the memory cells in that desired row, with the precharge circuitry maintaining the precharge voltage as being released between assertions of the word lines; and the precharge circuitry is configured to reinstate the precharge voltage after expiration of the given period of time for the last desired row.

The row decoder may be configured to selectively assert the word lines of desired rows simultaneously.

The row decoder may be configured to assert the word lines of desired rows sequentially.

The row decoder may be configured to assert the word lines of desired rows sequentially, under control of a counter, with the counter being incremented between assertion of different word lines.

The opposite logic states that the bit lines and complementary bit lines are driven to by the column driving circuitry may be such that the bit lines are driven to a logic 1 and the complementary bit lines are driven to a logic 0.

The opposite logic states that the bit lines and complementary bit lines are driven to by the column driving circuitry may be such that the bit lines are driven to a logic 0 and the complementary bit lines are driven to a logic 1.

The column driving circuitry may include: an inverter associated with each different bit line, that inverter having its output coupled to that bit line; and a multiplexing circuit. The multiplexing circuit may include: a different first multiplexer respectively associated with each different bit line; and a different second multiplexer respectively associated with each different complementary bit line; wherein each first multiplexer has a first data input coupled to the reset signal, a second data input coupled to the column decoder, a selection input coupled to the reset signal; wherein each second multiplexer has a first data input coupled to a complement of the reset signal, a second data input coupled to the column decoder, a selection input coupled to the reset signal; and wherein, in response to assertion of the reset signal, each first multiplexer and each second multiplexer of each selected column passes its first data input as output, thereby driving the bit lines and the complementary bit lines of the desired columns to the opposite logic states.

The column driving circuitry may include: an inverter associated with each different bit line, that inverter having its output coupled to that bit line; and a multiplexing circuit. The multiplexing circuit may include: a different first multiplexer and first additional multiplexer respectively associated with each different bit line; and a different second multiplexer and second additional multiplexer respectively associated with each different complementary bit line; wherein each first additional multiplexer has a first data input coupled to a logic high voltage, a second data input coupled to a logic low voltage, a selection input coupled to a logic state selection signal, and an output; wherein each first multiplexer has a first data input coupled to the output of the first additional multiplexer, a second data input coupled to the column decoder, a selection input coupled to the reset signal, and an output coupled to the inverter for its respective bit line; wherein each second additional multiplexer has a first data input coupled to a logic high voltage, a second data input coupled to a logic low voltage, a selection input coupled to a logic state selection signal, and an output; wherein each second multiplexer has a first data input coupled to the output of the first additional multiplexer, a second data input coupled to the column decoder, a selection input coupled to the reset signal, and an output coupled to its respective complementary bit line; and wherein, in response to assertion of the reset signal, each first multiplexer and each second multiplexer of each selected column passes its first data input as output, thereby driving the bit lines and the complementary bit lines of the desired columns to the opposite logic states.

BRIEF DESCRIPTION OF THE DRAWINGS

FIG. 3B is a timing diagram of the SRAM device of FIG. 2 when sequentially resetting multiple rows of memory cells to a default value of logic 0.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
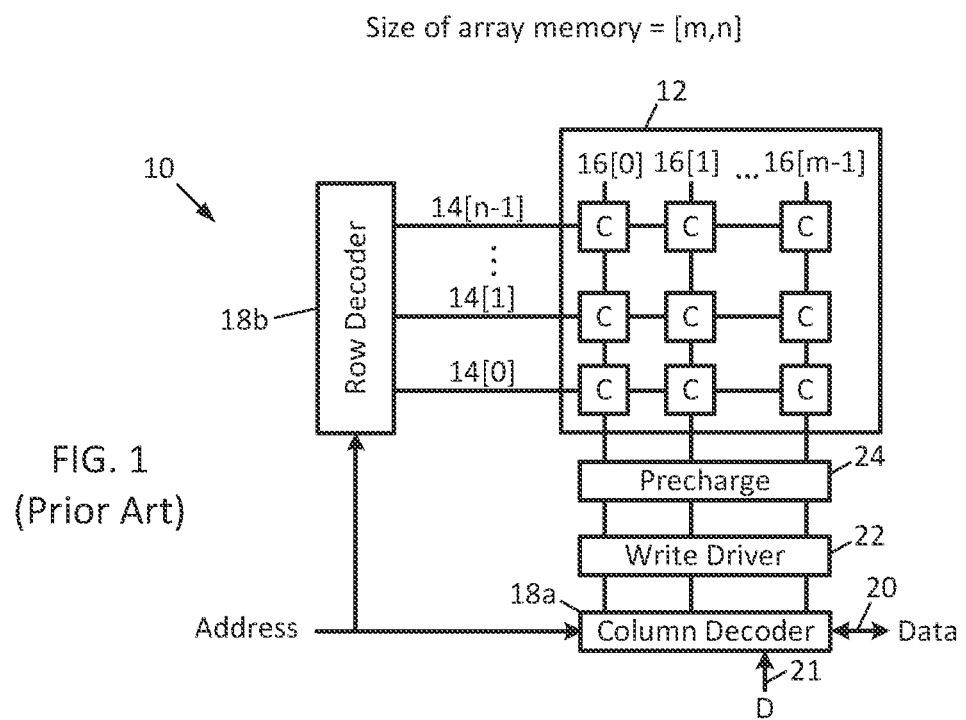
FIG. 1 is a block diagram of a conventional SRAM device.
Figure 2:
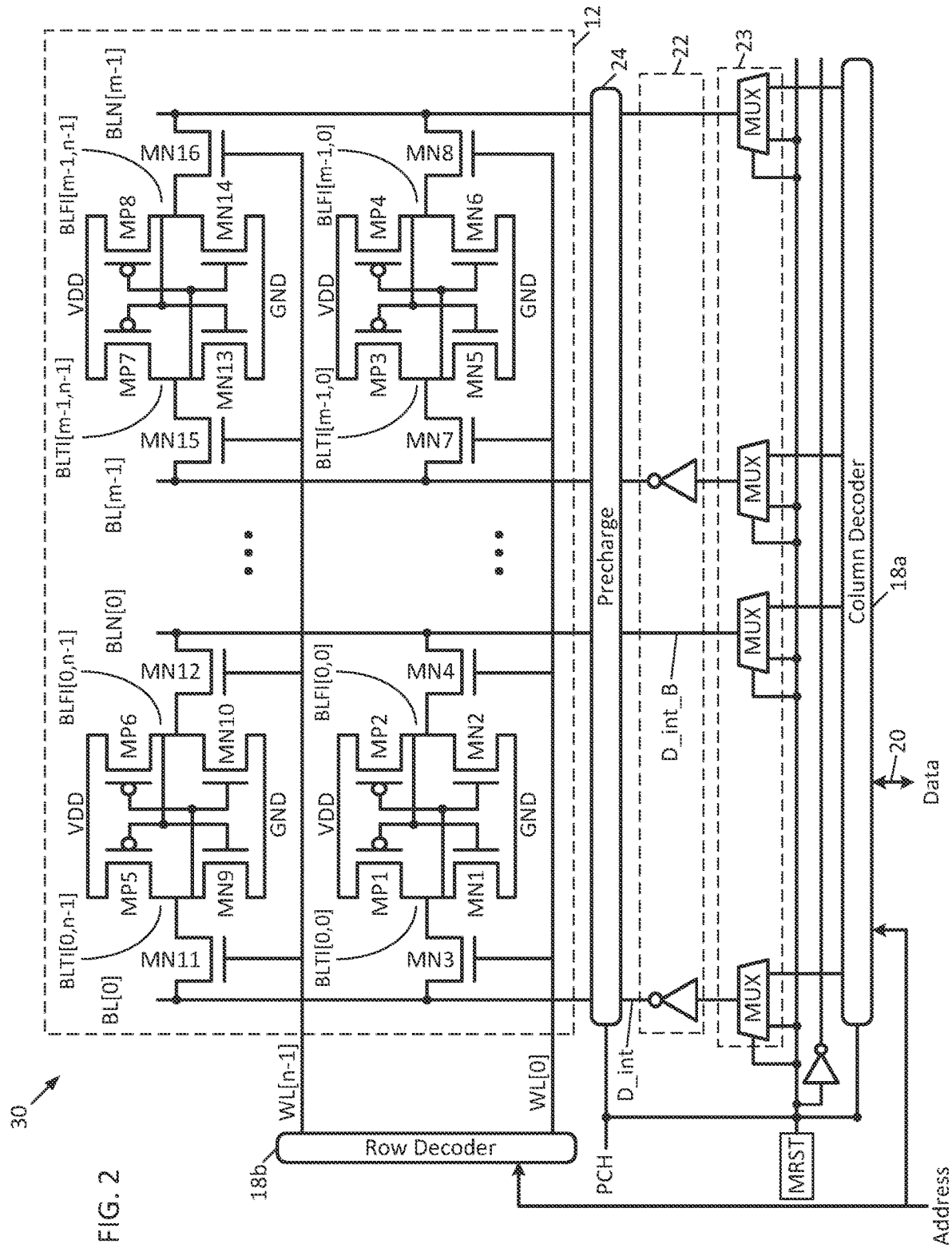
FIG. 2 is a schematic block diagram of a SRAM device disclosed herein which is capable of performing a fast and low-power reset of the memory array to default value of a logic 0, one row at a time.

Now described with initial reference to FIG. 2 is a SRAM device 30 on which a fast, lower-power consumption memory reset may be performed.

The SRAM device 30 includes a memory array 12. The memory array 12 has a size of m×n, with m being the number of columns and n being the number of rows. At each intersection of a column and row, a memory cell is present. For example, the memory cell C[0,0] located at a position in the memory array 12 wherein the 0-th pair of bit lines and 0-th word line cross is comprised of cross coupled inverters (the first inverter being a CMOS inverter formed by PMOS MP1 and NMOS MN1, the second inverter being a CMOS inverter formed by PMOS MP2 and NMOS MN2), with a transfer gate NMOS MN3 coupled between a node BLTI[0,0] at the drains of MP1 and MN1 and the bit line BL[0], and a transfer gate NMOS MN4 coupled between a node BLFI [0,0] at the drains of MP2 and MN2 and the complementary bit line BLN[0]. This memory cell C[0,0] is powered between a supply voltage VDD and ground GND.

Similarly, the memory cell C[m-1,0] located at a position in the memory array 12 wherein the (m-1)-th pair of bit lines and 0-th word line cross is comprised of cross coupled inverters (the first inverter being a CMOS inverter formed by PMOS MP3 and NMOS MN5, the second inverter being a CMOS inverter formed by PMOS MP4 and NMOS MN6), with a transfer gate NMOS MN7 coupled between a node BLTI[m-1,0] at the drains of MP3 and MN5 and the bit line BL[m-1], and a transfer gate NMOS MN8 coupled between a node BLFI[m-1,0] at the drains of MP2 and MN2 and the complementary bit line BLN[m-1]. This memory cell C[m-1,0] is powered between the supply voltage VDD and ground GND.

The memory cell C[0,n-1] located at a position in the memory array 12 wherein the 0-th pair of bit lines and (n-1)-th word line cross is comprised of cross coupled inverters (the first inverter being a CMOS inverter formed by PMOS MP5 and NMOS MN9, the second inverter being a CMOS inverter formed by PMOS MP6 and NMOS MN10), with a transfer gate NMOS MN11 coupled between a node BLTI[0,n-1] at the drains of MP5 and MN9 and the bit line BL[0], and a transfer gate NMOS MN12 coupled between a node BLFI[0,n-1] at the drains of MP6 and MN10 and the complementary bit line BLN[]. This memory cell C[0,n-1] is powered between the supply voltage VDD and ground GND.

The memory cell C[m-1,n-1] located at a position in the memory array 12 wherein the (m-1)-th pair of bit lines and (n-1)-th word line cross is comprised of cross coupled inverters (the first inverter being a CMOS inverter formed by PMOS MP7 and NMOS MN13, the second inverter being a CMOS inverter formed by PMOS MP8 and NMOS MN14), with a transfer gate NMOS MN15 coupled between a node BLTI[m-1,n-1] at the drains of MP7 and MN13 and the bit line BL[m-1], and a transfer gate NMOS MN16 coupled between a node BLFI[m-1, n-1] at the drains of MP8 and MN14 and the complementary bit line BLN[m-1]. This memory cell C[m-1,n-1] is powered between the supply voltage VDD and ground GND.

The memory cells in each row are controlled by a word line from among word lines WL[0], WL[n-1]. Selection of one or more rows is accomplished by the row decoder 18b asserting the associated one or ones of the word lines WL[0], WL[n-1]. Selection of one or more columns is accomplished by the column decoder 18a performing said selection.

Precharge circuitry 24 is coupled to each bit line and complementary bit line pair BL[0], BLN[0], . . . , BL[m-1], BLN[m-1], and is controlled by a precharge control signal PCH.

Write driver circuitry 22 is coupled to the multiplexing circuitry 21 and associated with the precharge circuitry 24. The write driver circuitry 22 includes, for each bit line BL[0], . . . , BL[m-1], an inverter having an input coupled to multiplexing circuitry 21 and an output coupled to the bit lines BL[0], . . . , BL[m-1].

The multiplexing circuitry 21 includes, for each bit line BL[0], . . . , BL[m-1] and complementary bit line BLN[0], . . . , BLN[m-1], a multiplexer MUX having a first data input coupled to the column decoder 18a, a second data input coupled to a reset signal MRST applied to a pin or a pad, a selection input (that determines which data input it passed as output) coupled to MRST, and an output coupled to that bit line or complementary bit line. Notice here that MRST is provided as an input to the column decoder 18b to permit the selection of desired columns (for example, the column decoder 18b may have internal circuitry that selects certain columns based upon MRST being asserted), and that MRST is coupled to the precharge circuitry 24 such that assertion of MRST can deactivate the precharge circuitry 24.

A standard write operation is described. Since this is a standard write operation, assume that MRST is at a logic low, resulting in the multiplexing circuitry 23 being transparent and connecting the column decoder 18a to the write driver circuitry 22.

Keep in mind that at this point, the bit lines BL[0], BL[m-1] and complementary bit lines BLN[0], BLN[m-1] were precharged by the precharge circuitry 24, as they were at the end of the prior operation. In this example, assume that the memory cell C[0,0] is to be set to hold a logic 0. Here, a predecoded row address is received by the row decoder 18b and a predecoded column address is received by the column decoder 18a. The column decoder 18a selects the column 0, meaning that BL[0] and BLN[0] are selected, while the other bit lines and complementary bit lines are deselected. Precharge is released, and the column decoder 18a outputs a data bit of 1 to the write driver circuitry 22, resulting in the signal D_int output by the inverter for the bit line BL[0] falling to a logic 0, and the signal D_int_B output by the multiplexer for the complementary bit line BLN[0] rising to a logic 1. The row decoder 18b asserts the word line WL[0] to flip the state of the memory cell C[0,0] such that BLTI[0,0] is at a logic zero and BLFI[0,0] is at a logic 1. Then, the row decoder 18b deasserts the word line WL[0] and the column decoder 20d deasserts the write driver by deasserting the MUX signal MUX[0], and the precharge control signal PCH is deasserted so that the precharge of the bit line BL[0] and complementary bit line BLN[0] is reinstated. This completes the reset of a desired cell, or of a desired row (if all columns were selected).

While this is functional, and allows for desired rows and desired columns of desired rows to be reset, the reinstatement of precharge after every reset of a row consumes power and time. Therefore, to perform a fast reset of multiple cells, the reset pin or pad MRST may have an asserted signal applied thereto. MRST is directly electrically connected to the precharge circuitry 24 such that assertion of MRST asserts the precharge control signal (to thereby release precharge), and as explained above, MRST is directly electrically connected to a selection input and a data input of the multiplexers of the multiplexing circuitry 23 so as to force D_int to a logic 0 and force D_int_B to a logic 1 when MRST is asserted. Thus, by asserting different word lines WL[0], . . . , WL[n-1] while MRST is maintained as asserted, the reset of the selected columns of those rows can be accomplished without the power consumption and time occupied by the reinstatement of precharge between rows. This will be described below.

A. Fast Reset of Single Row to Logic 0

Figure 3A:
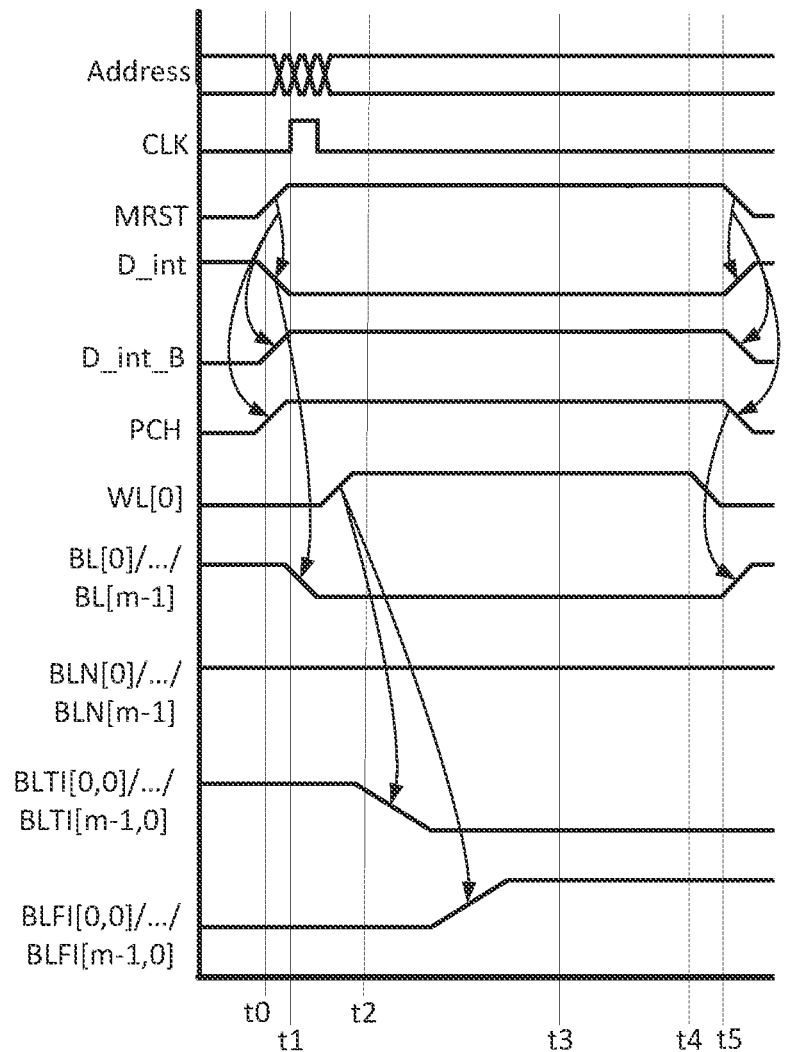
FIG. 3A is a timing diagram of the SRAM device of FIG. 2 when resetting a single row of memory cells to a default value of logic 0.

A fast reset enabled by the SRAM device 30 is now described with additional reference to the timing diagram of FIG. 3A. Assume here that it is desired to reset one row memory cells in the memory array 12, namely row 0.

To facilitate this, MRST is asserted at time t0, having the effect of releasing precharge on the bit lines BL[0], . . . , BL[m-1] and complementary bit lines BLN[0], . . . , BLN[m-1], and having the effect of setting the multiplexers so that D_int is forced to a logic 0 and D_int_B is forced to a logic 1. At this time, the address, indicating row 0, is decoded by the row decoder 18*b*. Also, the column decoder 18*a* selects all columns, meaning that all bit lines BL[0], . . . , BL[m-1] and complementary bit lines BLN[0], . . . , BLN[m-1] are selected.

Then, at time t1, the clock CLK is pulsed, and after the falling edge of the clock CLK, the row decoder 18*b* asserts the word line WL[0], allowing the states of the memory cells C[0,0], . . . , C[m-1,0] to be flipped to a logic zero at time t2, with the result being that the nodes BLTI[0,0], BLTI[m-1,0] fall to a logic low and that the nodes BLFI[0,0], BLFI[m-1,0] rise to a logic high. At time t3, note that due to the rising high of the nodes BLFI[0,0], . . . , BLFI[m-1], the complementary bit lines BLN[0], . . . , BLN[m-1] remain at a logic high. The reset of the memory cells C[0,0], . . . , C[0,m-1] is now complete, and the word line WL[0] is released (e.g., allowed to drop to a logic low) at time t4. Since the desired reset operation (the reset of row 0) has been performed, at time t5, MRST and PCH are released (e.g., allowed to drop to a logic row), and the bit lines BL[0], . . . , [m-1] rise back to a logic high accordingly.

Note that the states of the memory cells C[0,0], . . . , C[m-1,0] are flipped all at once, without each word requiring a separate write cycle per word. Thus, in the example shown where there are n rows and m columns, assuming for the sake of simplicity that each word is one bit, it took but one write cycle (i.e., one clock cycle) to write a logic 0 to all memory cells (e.g., reset the cells) of row 0, instead of taking m write cycles (i.e., m clock cycles) to write a logic 0 to all memory cells of row 0.

Understand that although in this particular example all columns of the selected rows are reset, fewer than all columns may be reset—whichever columns are selected by the column decoder 18*a* are reset through the above operations. Thus, the above operations can be used to reset selected columns of selected rows.

B. Fast Reset of Multiple Rows to Logic 0 Sequentially

As another example, assume that it is desired to reset two rows of memory cells in the memory array 12, here, rows 0 and n-1. To make this happen, referring additionally to FIG. 3B, MRST is asserted at time t0, having the effect of releasing precharge on the bit lines BL[0], . . . , BL[m-1] and complementary bit lines BLN[0], . . . , BLN[m-1], and having the effect of setting the multiplexers so that D_int is forced to a logic 0 and D_int B is forced to a logic 1. At this time, the address, indicating row 0, is decoded by the row decoder 18*b*. Also, the column decoder 18*a* selects all columns, indicating that all bit lines BL[0], . . . , BL[m-1] and complementary bit lines BLN[0], . . . , BLN[m-1] are selected.

Then, at time t1, the clock CLK is pulsed, and after the falling edge of the clock, the row decoder 18*b* asserts the word line WL[0], allowing the states of the memory cells C[0,0], C[m-1,0] to be flipped to a logic zero at time t2, meaning that the nodes BLTI[0,0], . . . , BLTI[m-1,0] fall to a logic low and that the nodes BLFI[0,0], . . . , BLFI[m-1,0] rise to a logic high. Note that the states of the memory cells C[0,0], . . . , C[m-1,0] are flipped all at once. At time t3, due to rising high of the nodes BLFI[0,0], . . . , BLFI[m-1,0], the complementary bit lines BLN[0], . . . , BLN[m-1] remain at a logic high.

At time t4, the row decoder 18*b* deasserts the word line WL[0]. This completes the reset of the memory cells C[0,0], . . . , C[m-1,0], and then the memory cells C[0,n-1], . . . , C[m-1,n-1] can be reset. Note that at the end of the reset of memory cells C[0,0], . . . , C[m-1,0], MRST is not released (e.g., remains asserted), and PCH is not released (e.g., remains asserted), while no precharge is performed on the bit lines BL[0], . . . , BL[m-1] and complementary bit lines BLN[0], . . . , BLN[m-1].

For the reset of the memory cells C[0,n-1], . . . , C[m-1,n-1], since the states of the bit lines BL[0], . . . , BL[m-1] and complementary bit lines BLN[0], . . . , BLN[m-1] are already as needed to perform a reset, to reset the memory cells C[0,n-1], . . . , C[m-1,n-1], a new address is received, and this address, which indicates row n-1, is decoded by the row decoder 18*b*. Then, at time t5, the clock CLK is pulsed, and after the falling edge of the clock, the row decoder 18*b* asserts the word line WL[n-1].

The states of the memory cells C[0,n-1], . . . , C[m-1,n-1] are flipped to a logic zero at time t6, meaning that the nodes BLTI[0,n-1], . . . , BLTI[m-1,n-1] fall to a logic low and that the nodes BLFI[0,n-1], . . . , BLFI[m-1,n-1] rise to a logic high. After this, the reset of the memory cells C[0,n-1], . . . , C[m-1,n-1] is complete, and the word line WL[n-1] is released at time t7.

Although in this particular example, the reset of two rows sequentially is described, understand that the above may be repeated to reset as many rows as desired, and those rows need not be sequential (e.g., row 0 may be reset, then row 2 may be reset, then row 4 may be reset, etc.). Also understand that although in this particular example all columns of the selected rows are reset, fewer than all columns may be reset—whichever columns are selected by the column decoder 18*a* are reset through the above operations. The column decoder 18*a* may effectuate this via internal circuitry that selects the desired columns in response to assertion of the MRST signal.

Since the desired reset operation (the reset of rows 0 and n-1) has been performed, at time t8, MRST and PCH are released (e.g., allowed to drop to logic low), so the bit lines BL[0], . . . , BL[m-1] rise back high. Note that the states of the memory cells C[0,0], . . . , C[m-1,0] are flipped all at once, without each word requiring a separate write cycle. Thus, assuming for the sake of simplicity that each word is one bit, it took but one write cycle (i.e., one clock cycle) to write a logic zero to all memory cells (e.g., reset the cells) within row 0, instead of taking m write cycle (i.e., m clock cycles). Similarly, the states of the memory cells C[0,n-1], . . . , C[m-1,n-1] are all flipped at once, therefore taking but one write cycle to reset as well. Thus, overall, to reset rows 0 and n-1, only two clock cycles were used, as opposed to m clock cycles per row.

It is to be appreciated that in addition to this time saving, due to the fact that the bit lines BL[0], . . . , BL[m-1] and complementary bit lines BLN[0], . . . , BLN[m-1] are not precharged until the reset is complete, the power that would have been consumed by multiple precharges is saved. Therefore, in addition to saving time, this design saves power. Indeed, due to the elimination of precharge between reset of rows and between reset of words, power consumption is reduced by a factor of 1/(m*n), which has the added benefit of helping ensure that the current drawn during state change of the memory cells is not great enough to cause device malfunction.

C. Fast Reset of Multiple Rows to Logic 0 Simultaneously

In the above example where it was desired to reset multiple rows, the rows were sequentially reset, with one row being reset, and when that reset is complete, then the next row being reset, with precharge being initially released and kept released until all desired rows are reset. Instead of sequentially resetting rows one after another, multiple rows may be reset at the same time. Indeed, any number of rows may be reset at the same time (e.g., two rows may be reset at the same time, four rows may be reset at the same time, eight rows may be reset at the same time, etc.). Note here that the strength of the write drivers 22 may be increased to enable the parallelism of multiple rows being reset simultaneously.

Figure 4:
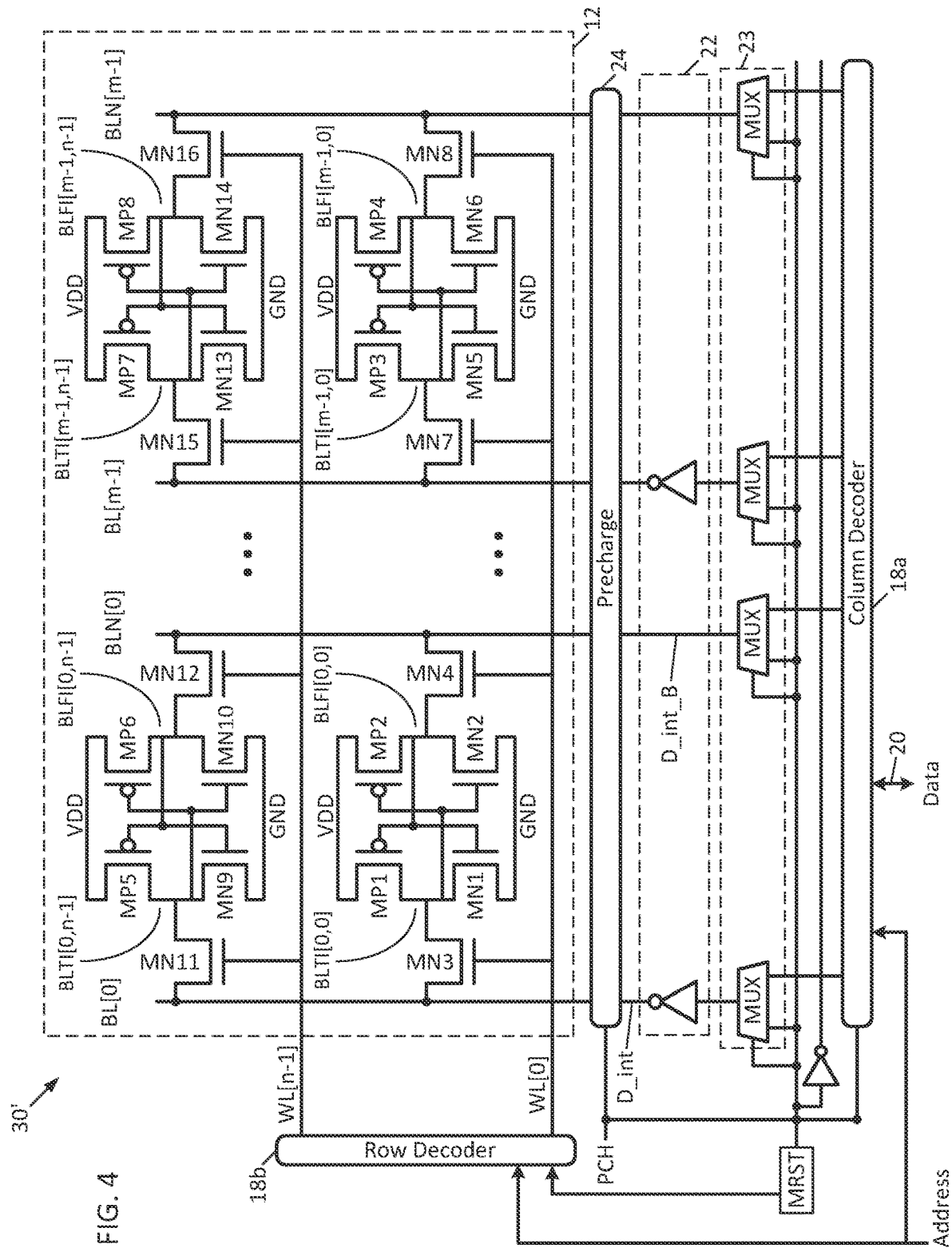
FIG. 4 is a schematic block diagram of a SRAM device disclosed herein which is capable of performing a fast and low-power reset of the memory array to a default value of logic 0, multiple rows at a time.

To facilitate the reset of multiple rows, the embodiment of the SRAM device 30' shown in FIG. 4 is the same as the SRAM device 30 of FIG. 2, but has MRST coupled to the row decoder 18b in order to instruct the row decoder 18b to activate multiple word lines simultaneously. The row decoder 18b may have internal circuitry within that causes the assertion of multiple word lines simultaneously in response to MRST being asserted, for example.

Figure 5:
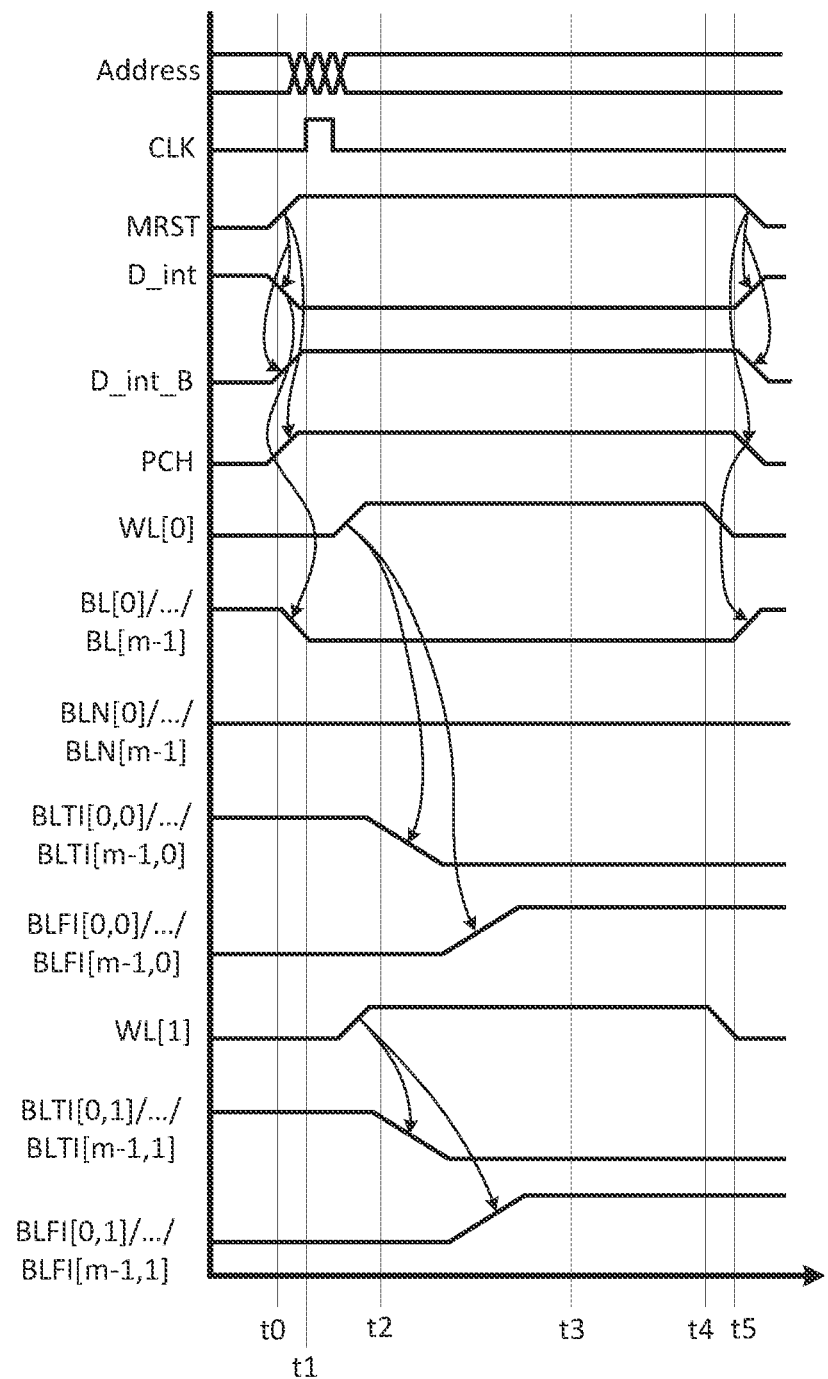
FIG. 5 is a timing diagram of the SRAM device of FIG. 4 when simultaneously resetting multiple rows of memory cells to a default value of logic 0.

With additional reference to FIG. 5, assume for this example that it is desired to reset rows 0 and n-1 at the same time. The operation to reset multiple rows at the same time is now described. MRST is asserted at time t0, having the effect of releasing precharge on the bit lines BL[0], . . . , BL[m-1] and complementary bit lines BLN[0], . . . , BLN[m-1], and having the effect of setting the multiplexers so that D_int is forced to a logic 0 and D_int_B is forced to a logic 1.

Then, at time t1, the clock signal CLK is pulsed, and the row decoder 18b simultaneously asserts the word lines WL[0] and WL[n-1] after the falling edge of CLK as shown, allowing the states of the memory cells C[0,0], . . . , C[m-1,0] and C[0,n-1], . . . , C[m-1,n-1] to be flipped to a logic zero at time t2, meaning that the nodes BLTI[0,0], . . . , BLTI[m-1,0] and BLTI[0,n-1], . . . , BLTI[m-1,n-1] fall to a logic low and that the nodes BLFI[0,0], . . . , BLFI[m-1,0] and BLFI[0,n-1], . . . , BLFI[m-1,n-1] rise to a logic high. Note that the states of the memory cells C[0,0], . . . , C[m-1,0] and C[0,n-1], . . . , C[m-1,n-1] are flipped all at once. At time t3, due to rising high of the nodes BLFI[0,0], . . . , BLFI[m-1,0], the complementary bit lines BLN[0], . . . , BLN[m-1] remain at a logic high.

At time t4, the row decoder 18b deasserts the word lines WL[0] and WL[n-1]. This completes the reset of the memory cells C[0,0], . . . , C[m-1,0] and C[0,n-1], C[m-1,n-1]. Appreciate here that all columns of the rows 0 and n-1 have been reset simultaneously, meaning that it may be helpful to increase the strength of the write drivers 22 to help ensure sufficient capability to reset the memory cells simultaneously to the desired default value.

After this, the reset of the memory cells C[0,n-1], . . . , C[m-1,n-1] is complete, and MRST (and therefore also PCH) is released at time t5. This reinstates precharge, charging the bit lines BL[0], . . . , BL[m-1] back high.

Note that instead of one write cycle (i.e., clock cycle) being performed per word in each row, only one write cycle total is performed in order to reset all columns of the selected rows 0 and n-1 simultaneously. This drastically cuts down on the number of clock cycles used to reset the rows 0 and n-1. Also, since a precharge is not performed until the end of the single write cycle, this drastically cuts down on the amount of power consumed. Indeed, power consumption is reduced by a factor of 1/n because a precharge between each row is eliminated, which has the added benefit of helping ensure that the current drawn during state change of the memory cells is not great enough to cause device malfunction.

Although in this particular example, the reset of two rows simultaneously is described, understand that the above may be used to simultaneously reset as many rows as desired, and those rows need not be sequential (e.g., rows 0, 2, 4, and 6 may be reset, etc.). Further understand that the above may be used to sequentially reset multiple groups of rows simultaneously (e.g., rows 0, 2, 4, and 6 may be simultaneously reset, then rows 1, 3, 5, and 7 may next be simultaneously reset, etc.). Also understand that although in this particular example all columns of the selected rows are reset, fewer than all columns may be reset—whichever columns are selected by the column decoder 18a are reset through the above operations. The column decoder 18a may effectuate this via internal circuitry that selects the desired columns in response to assertion of the MRST signal.

D. Use of Counter to Control Row Decoder

In the example above in section B, multiple rows were sequentially reset, with a new address being received after the reset of each individual row indicating which row is to next be reset. It may instead be desired for certain rows to be reset, without the need for receipt of a new address for each row to be reset.

Figure 6:
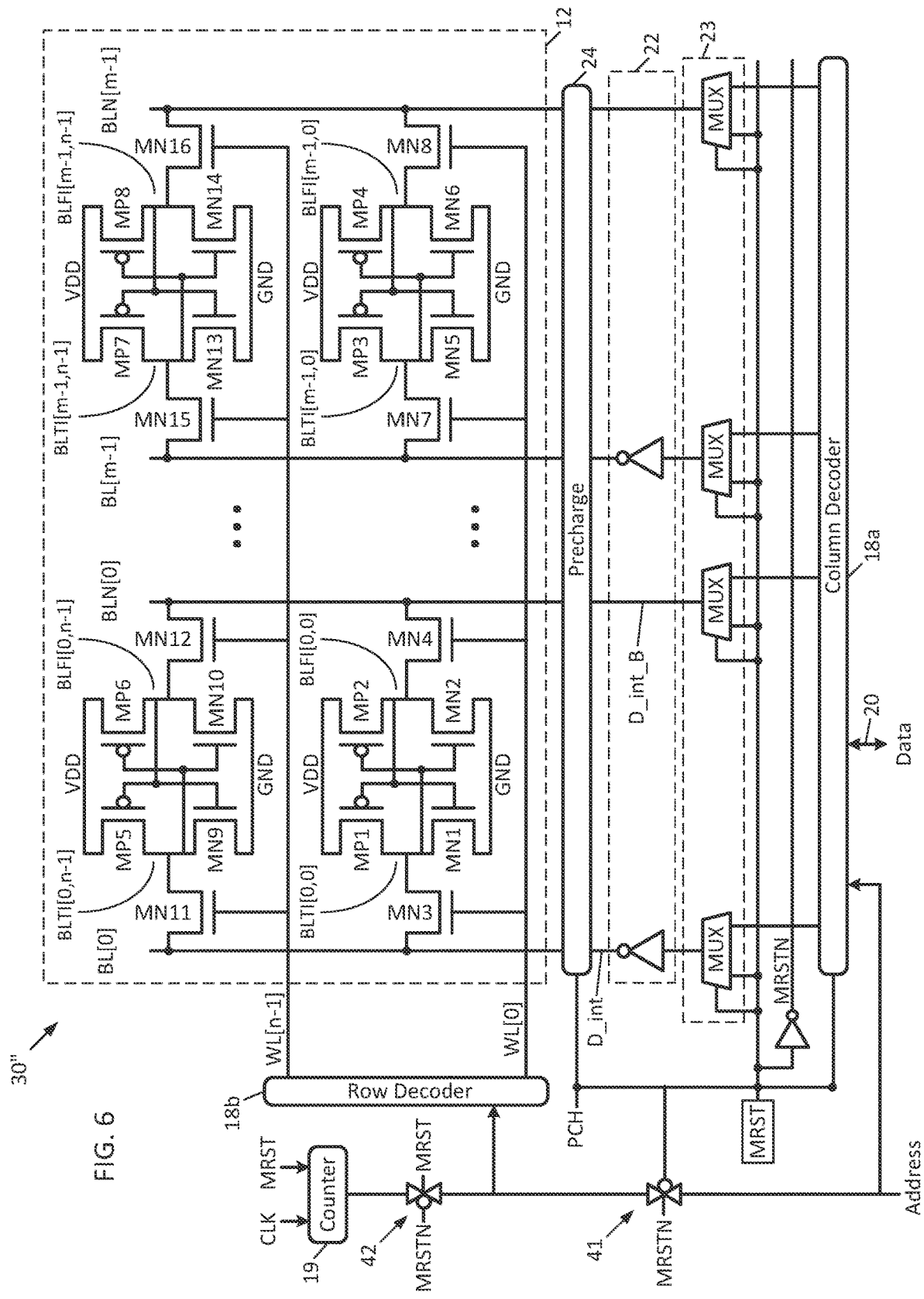
FIG. 6 is a schematic block diagram of a SRAM device disclosed herein which is capable of performing a fast and low-power reset of the memory array to a default value of a logic 0, one row at a time, with a counter controlling the row decoder.

To facilitate this, the SRAM device 30" of FIG. 6 includes a counter 19 that is clocked by the clock CLK, and is reset by MRST. The counter 19 is selectively coupled to the row decoder 18b by a transmission gate 42, the transmission gate 42 being activated to pass output from the counter 19 to the row decoder 18b when MRST is asserted. Additionally, when MRST is asserted, a transmission gate 41 disconnects the address input from the row decoder 18b, so that the row decoder 18b operates based upon the output from the counter 19.

In operation therefore, the output of the counter 19 determines which word line WL[0], . . . , WL[n-1] is asserted by the row decoder 18b. The counter 19 may count from an initial value (e.g., 0) to a final value (e.g., 15) by any increment (e.g., count by 1, count by 2, count by 4, etc.).

Other than the counter 19 and transmission gates 41 and 42, the SRAM device 30" is the same as the SRAM device 30 described above with reference to FIG. 2.

Figure 7:
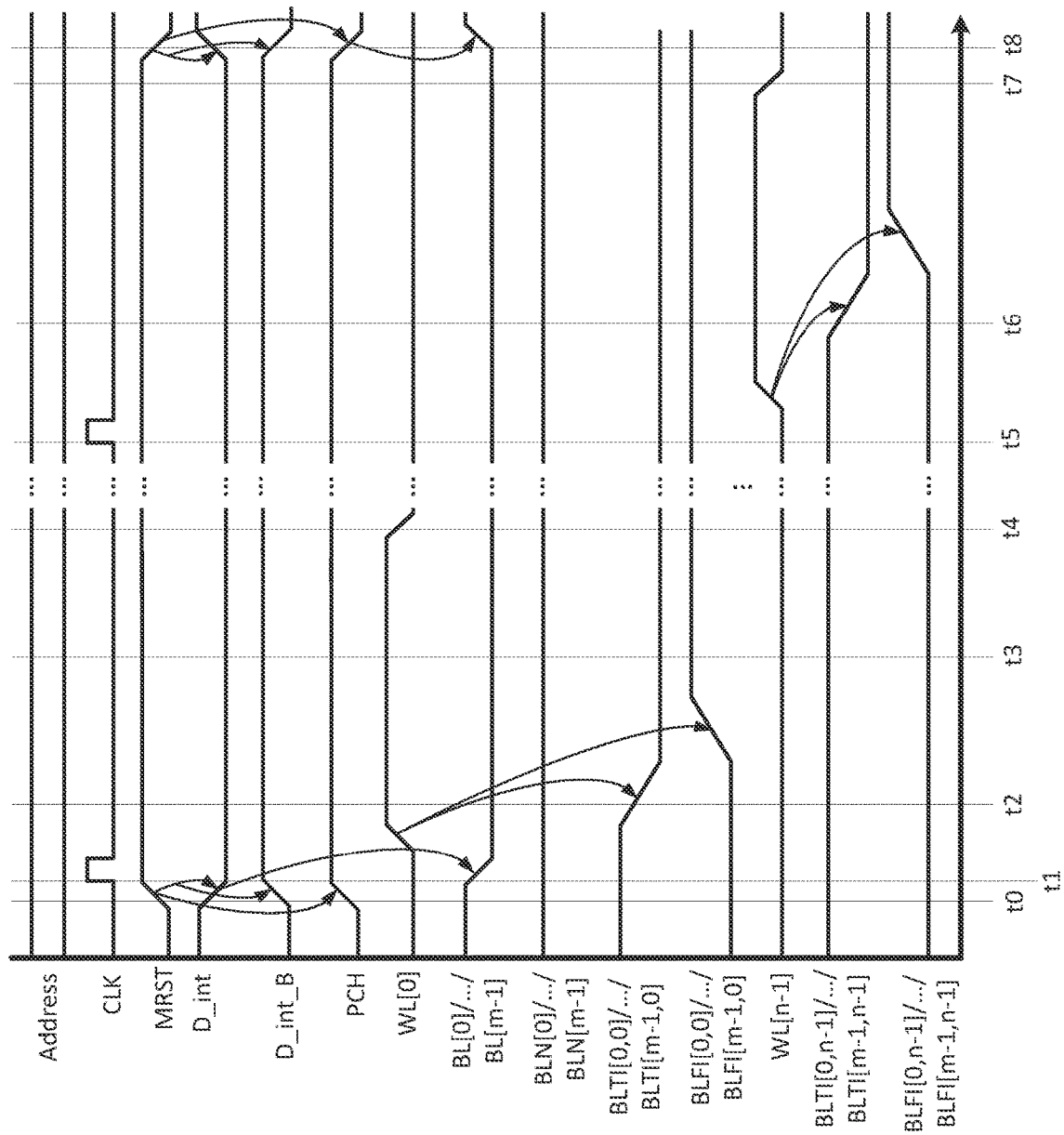
FIG. 7 is a timing diagram of the SRAM device of FIG. 6 when sequentially resetting multiple rows of memory cells to a default value of logic 0.

Operation using the counter 19 is now described with additional reference to FIG. 7.

Assume that it is desired to reset all rows of memory cells in the memory array 12, here, rows 0 to n-1. To make this happen, MRST is asserted at time t0, having the effect of releasing precharge on the bit lines BL[0], . . . , BL[m-1] and complementary bit lines BLN[0], . . . , BLN[m-1], and having the effect of setting the multiplexers so that D_int is forced to a logic 0 and D_int_B is forced to a logic 1. Notably here, the assertion of MRST resets the counter 19, opens the transmission gate 42 (causing it to act as a short), and closes the transmission gate 19 (causing it to act as an open circuit). Also, at this time, the column decoder 18a selects all columns, indicating that all bit lines BL[0], . . . , BL[m-1] and complementary bit lines BLN[0], . . . , BLN[m-1] are selected.

Then, at time t1, the clock CLK is pulsed, and after the falling edge of the clock, the counter 19 begins to count, here at 0, and therefore first outputs a 0 to the row decoder. Also after the falling edge of the clock CLK, the row decoder 18b asserts the word line corresponding to the first output of the counter 19, which here is word line WL[0]. This allows the states of the memory cells C[0,0], . . . , C[m-1,0] to be flipped to a logic zero at time t2, meaning that the nodes BLTI[0,0], . . . , BLTI[m-1,0] fall to a logic low and that the nodes BLFI[0,0], . . . , BLFI[m-1,0] rise to a logic high. Note that the states of the memory cells C[0,0], . . . , C[m-1,0] are flipped all at once. At time t3, due to rising high of the nodes BLFI[0,0], . . . , BLFI[m-1,0], the complementary bit lines BLN[0], . . . , BLN[m-1] remain at a logic high. At time t4, the row decoder 18b deasserts the word line WL[0]. This completes the reset of the memory cells C[0,0], . . . , C[m-1,0]. Note that, as explained above, at the end of the reset of memory cells C[0,0], . . . , C[m-1,0], MRST is not released (e.g., remains asserted), and PCH is not released (e.g., remains asserted), while no precharge is performed on the bit lines BL[0], . . . , BL[m-1] and complementary bit lines BLN[0], . . . , BLN[m-1].

At time t5, another clock pulse CLK is received, incrementing the counter 19. Assume in this example that rows 2 through n-2 have already been reset by time t5, with one clock pulse CLK being received per row to be reset and with the counter 19 being incremented after each row. At time t5, the clock pulse CLK increments the counter 19 to n-1, which is output to the row decoder 18b.

For the reset of the memory cells C[0,n-1], . . . , C[m-1,n-1], since the states of the bit lines BL[0], . . . , BL[m-1] and complementary bit lines BLN[0], . . . , BLN[m-1] are already as needed to perform a reset, to reset the memory cells C[0,n-1], . . . , C[m-1,n-1], after time t5, the row decoder 18b asserts the word line WL[n-1].

The states of the memory cells C[0,n-1], . . . , C[m-1,n-1] are flipped to a logic zero at time t6, meaning that the nodes BLTI[0,n-1], . . . , BLTI[m-1,n-1] fall to a logic low and that the nodes BLFI[0,n-1], . . . , BLFI[m-1,n-1] rise to a logic high. After this, the reset of the memory cells C[0,n-1], . . . , C[m-1,n-1] is complete, and the word line WL[n-1] is released at time t7. At time t8, MRST is released, having the effect of releasing PCH, and therefore charging the bit lines BL[0], . . . , BL[m-1] back high.

Note that the states of the memory cells C[0,n-1], . . . , C[m-1,n-1] of each row in turn are flipped all at once, without each word requiring a separate write cycle. Thus, assuming for the sake of simplicity that each word is one bit, it took but one write cycle (i.e., one clock cycle) to write a logic zero to all memory cells (e.g., reset the cells) within each individual row, instead of taking m write cycle (i.e., m clock cycles). Therefore, using this technique, it takes one clock cycle per row to be reset to perform said reset.

Although in this particular example, the reset of all rows sequentially is described, using the counter 19 to generate the addresses used by the row decoder 18b, understand that the operation of the counter 19 may be altered to reset as many rows as desired, and those rows need not be sequential (e.g., row 0 may be reset, then row 2 may be reset, then row 4 may be reset, etc.). Also understand that although in this particular example all columns of the selected rows are reset, fewer than all columns may be reset—whichever columns are selected by the column decoder 18a are reset through the above operations. The column decoder 18a may effectuate this via internal circuitry that selects the desired rows in response to assertion of the MRST signal.

E. Fast Reset of Multiple Rows Sequentially, With Selectable Reset Value

In the above described examples, the memory cells of the selected rows and columns that were reset, were reset to a logic 0. It should be appreciated that instead, those memory cells could be reset to a logic 1. For example, the data inputs of the multiplexers that are coupled to MRST could instead be coupled to its complement, MRSTN.

Figure 8:
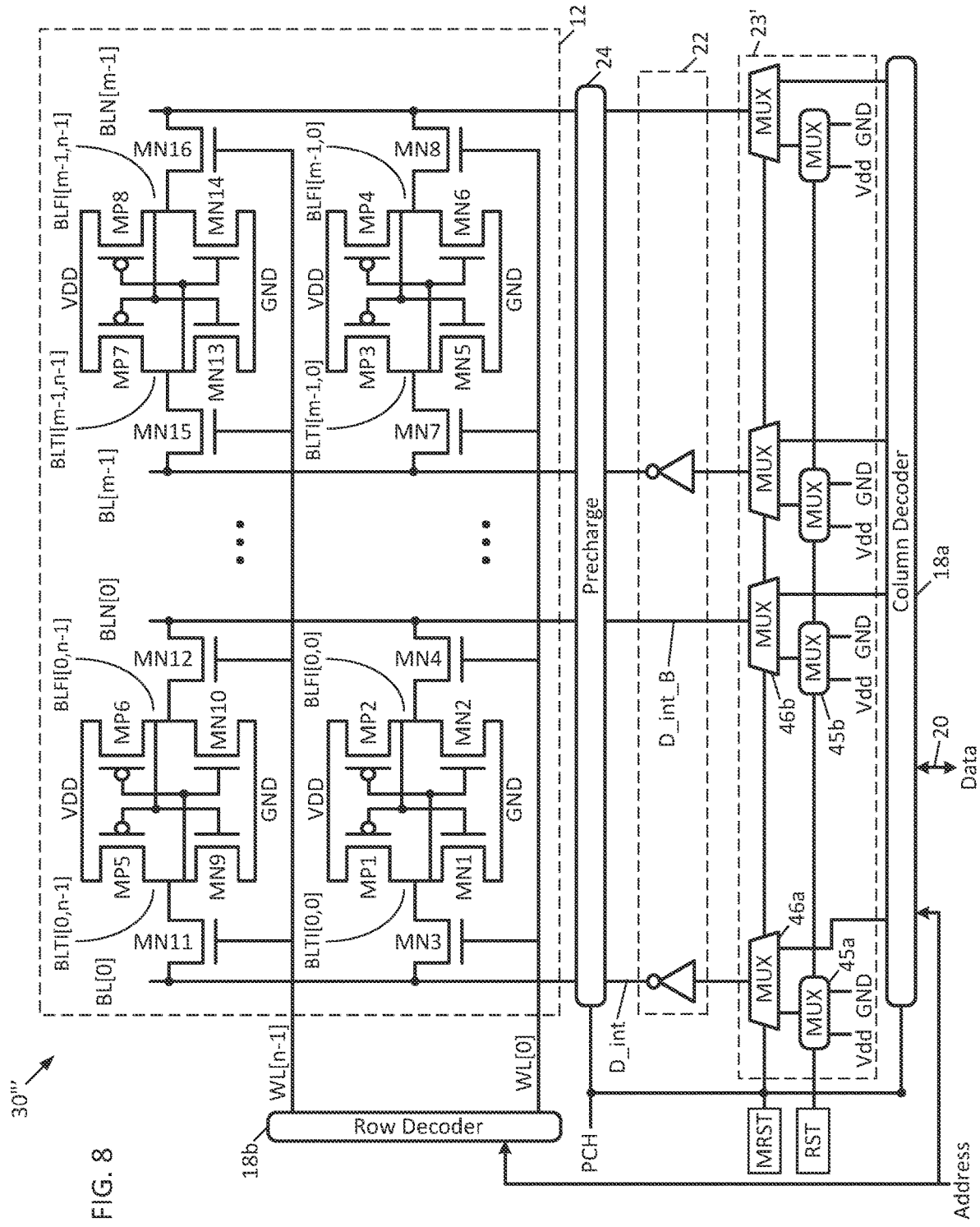
FIG. 8 is a schematic block diagram of a SRAM device disclosed herein which is capable of performing a fast and low-power reset of the memory array to either a default value of a 1 or a default value of a 0, one row at a time.

Also, it may be desired for the value that the memory cells of the selected rows and columns are reset to, to be selectable. An embodiment with this capability is shown in FIG. 8.

The SRAM device 30''' is the same as the SRAM device 30 of FIG. 2, except for differences in the multiplexing circuitry 23'. Here, the multiplexing circuitry 23' includes, for each bit line BL[0], . . . , BL[m-1]: a first multiplexer 45a having a first data input coupled to VDD, a second data input coupled to ground, a selection input coupled to a reset signal RST, and an output; and a second multiplexer 46a having a first data input coupled to the output of the first multiplexer 45a, a second data input coupled to receive output from the column decoder 18a, a selection input coupled to MRST, and an output coupled to the driver circuitry 22. Similarly, the multiplexing circuitry 23' includes, for each complementary bit line BLN[0], . . . , BLN[m-1]: a first multiplexer 45b having a first data input coupled to VDD, a second data input coupled to ground, a selection input coupled to a reset signal RST, and an output; and a second multiplexer 46b having a first data input coupled to the output of the first multiplexer 45b, a second data input coupled to receive output from the column decoder 18a, a selection input coupled to MRST, and an output coupled to the driver circuitry 22.

Figure 9B:
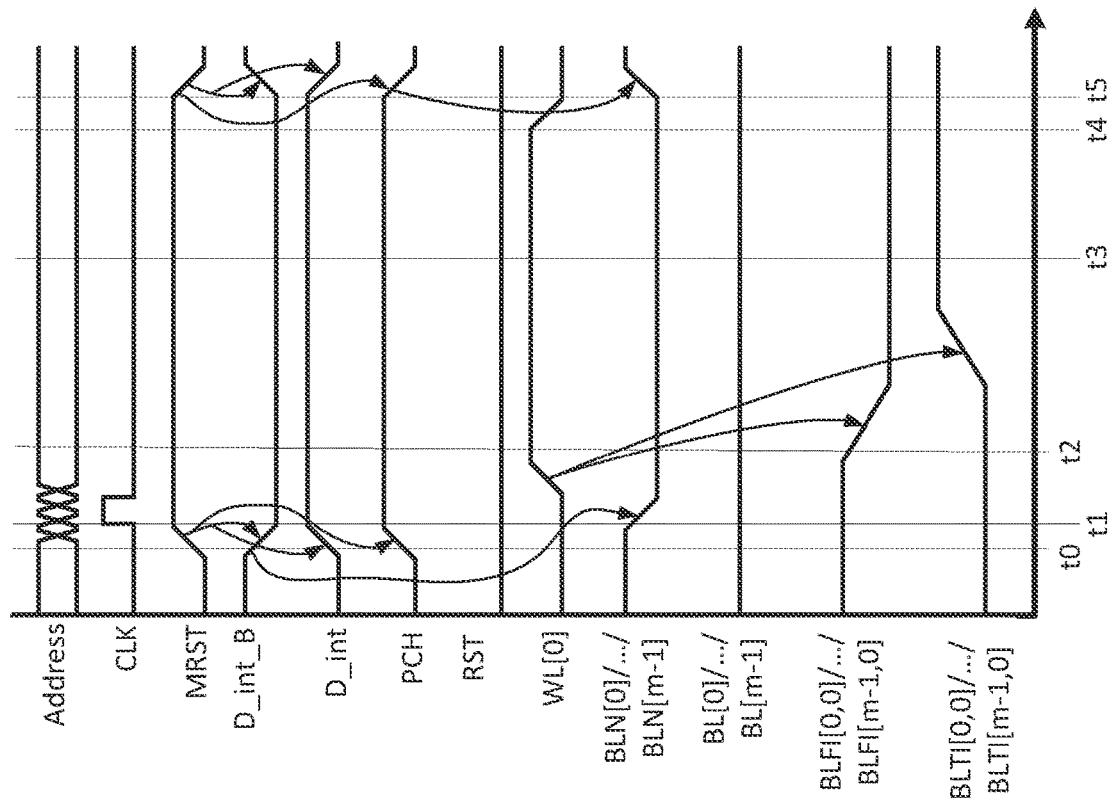
FIG. 9B is a timing diagram of the SRAM device of FIG. 8 when resetting a single row of memory cells to a default value of logic 1.
Figure 9A:
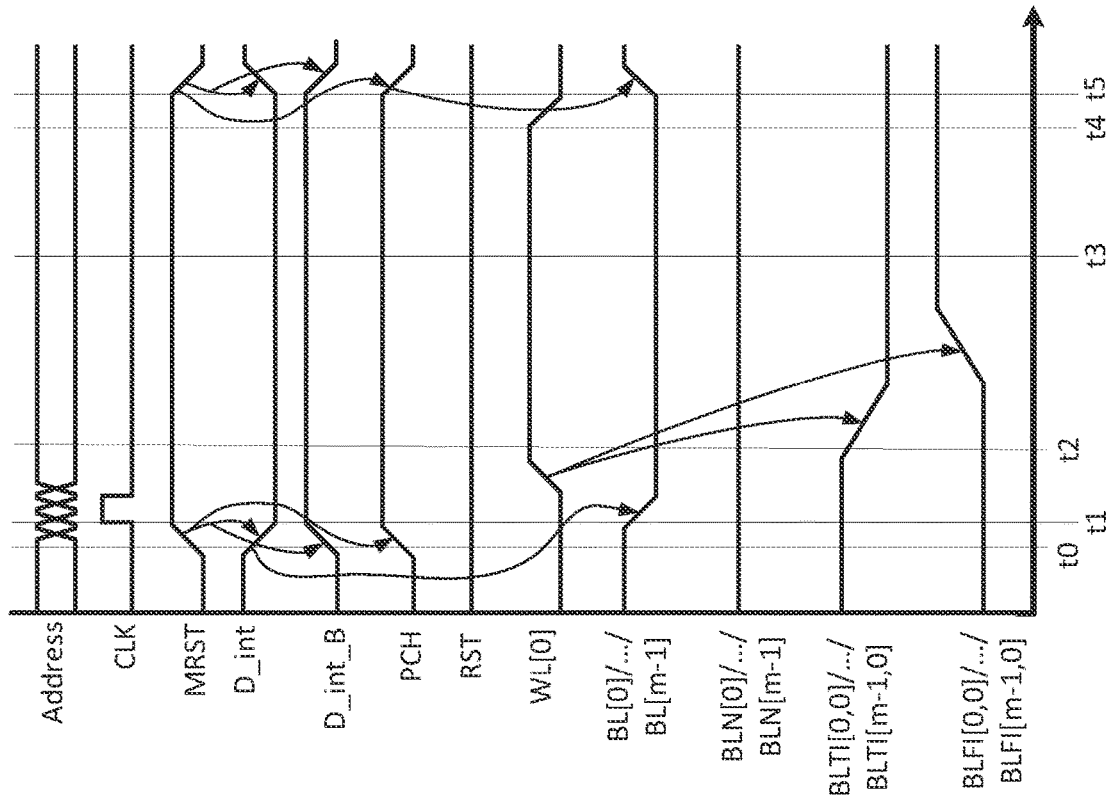
FIG. 9A is a timing diagram of the SRAM device of FIG. 8 when resetting a single row of memory cells to a default value of logic 0.

Here, MRST operates as described with reference to the SRAM device 30 of FIG. 2, with RST acting to select the values of D_int and D_int B when the multiplexer 46a receives MRST as being asserted. As shown in FIGS. 9A-9B, the SRAM device 30''' operates identically to the SRAM device 30, except that, as stated, the value of RST selects the values of D_int and D_int B when MRST is asserted. Thus, as shown in FIG. 9A, when RST is at a logic high and MRST is asserted, D_int is forced to a logic 0 and D_int B is forced to a logic 1, and operation is identical to that described above with reference to FIG. 3A.

As shown in FIG. 9B, when RST is at a logic low and MRST is asserted, D_int is forced to a logic 1 and D_int B is forced to a logic 0. In greater detail, MRST is asserted at time t0, having the effect of releasing precharge on the bit lines BL[0], . . . , BL[m-1] and complementary bit lines BLN[0], . . . , BLN[m-1], and having the effect of setting the multiplexers so that D_int is forced to a logic 1 and D_int B is forced to a logic 0. At this time, the address, indicating row 0, is decoded by the row decoder 18b. Also, the column decoder 18a selects all columns, meaning that all bit lines BL[0], . . . , BL[m-1] and complementary bit lines BLN[0], . . . , BLN[m-1] are selected.

Then, at time t1, the clock CLK is pulsed, and after the falling edge of the clock, the row decoder 18b asserts the word line WL[0], allowing the states of the memory cells C[0,0], . . . , C[m-1,0] to be flipped to a logic one at time t2, with the result being that the nodes BLTI[0,0], . . . , BLTI[m-1,0] rise to a logic high and that the nodes BLFI[0,0], . . . , BLFI[m-1,0] fall to a logic low. At time t3, note that due to the falling low of the nodes BLFI[0,0], . . . , BLFI[m-1], the bit lines BL[0], . . . , BL[m-1] remain at a logic high. The reset of the memory cells C[0,0], . . . , C[0,m-1] is now complete, and the word line WL[0] is released (e.g., allowed to drop to a logic low) at time t4. Since the desired reset operation (the reset of row 1) has been performed, at time t5, MRST and PCH are released (e.g., allowed to drop to a logic row), and the complementary bit lines BLN[0], . . . , BLN[m-1] rise back to a logic high.

Understand that although in this particular example all columns of the selected rows are reset, fewer than all columns may be reset—whichever columns are selected by the column decoder 18a are reset through the above operations. The column decoder 18a may effectuate this via internal circuitry that selects the desired rows in response to assertion of the MRST signal.

Figure 10A:
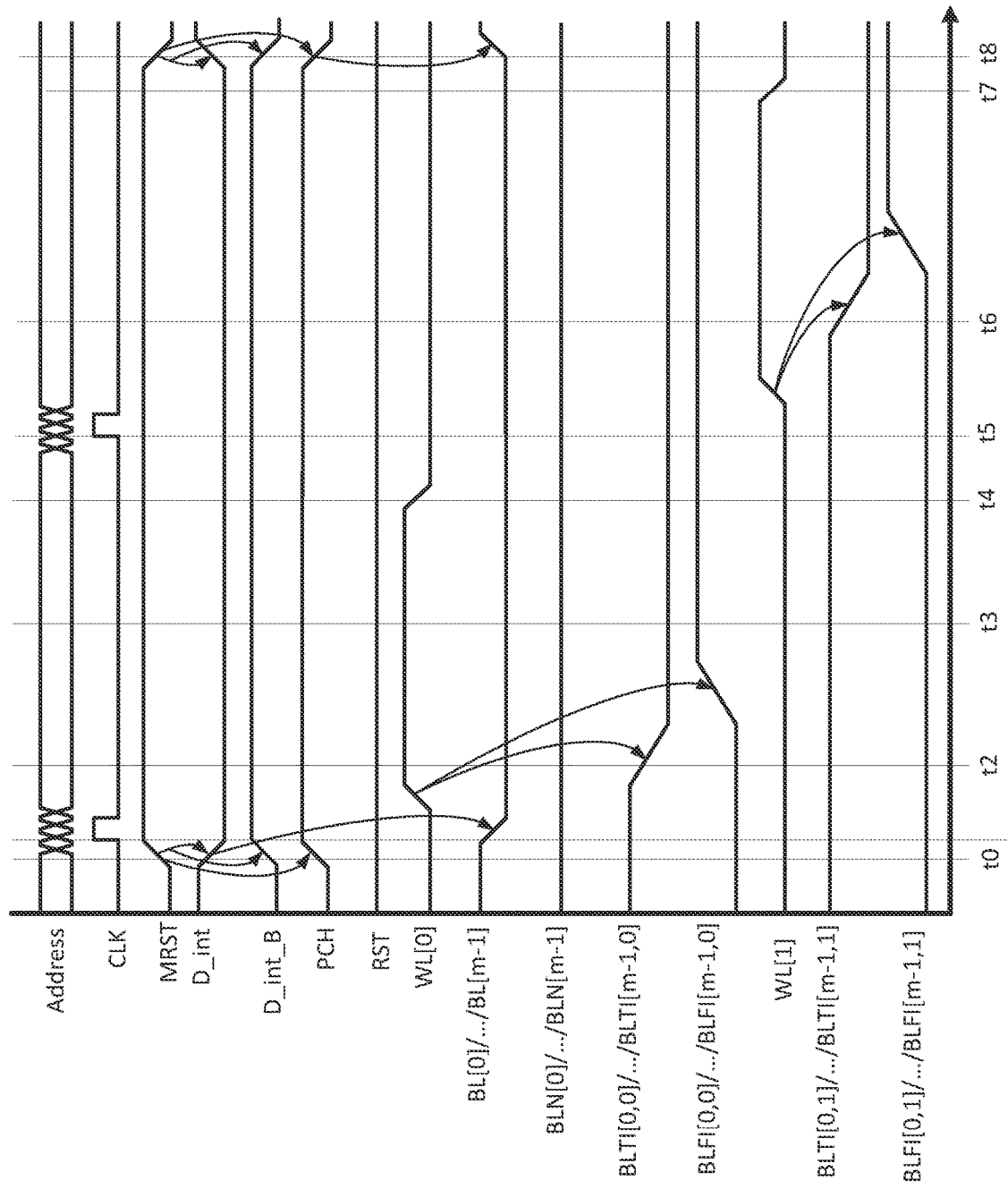
FIG. 10A is a timing diagram of the SRAM device of FIG. 8 when sequentially resetting multiple rows of memory cells to a default value of logic 0.

An example of the use of the SRAM device 13''' to reset multiple rows sequentially is shown in FIG. 10A. As can be observed in FIG. 10A, the SRAM device 30''' operates identically to the SRAM device 30, except that, as stated, the value of RST selects the values of D_int and D_int B when MRST is asserted. Thus, as shown in FIG. 10A, when RST is at a logic high and MRST is asserted, D_int is forced to a logic 0 and D_int_B is forced to a logic 1, and operation is identical to that described above with reference to FIG. 3B.

Figure 10B:
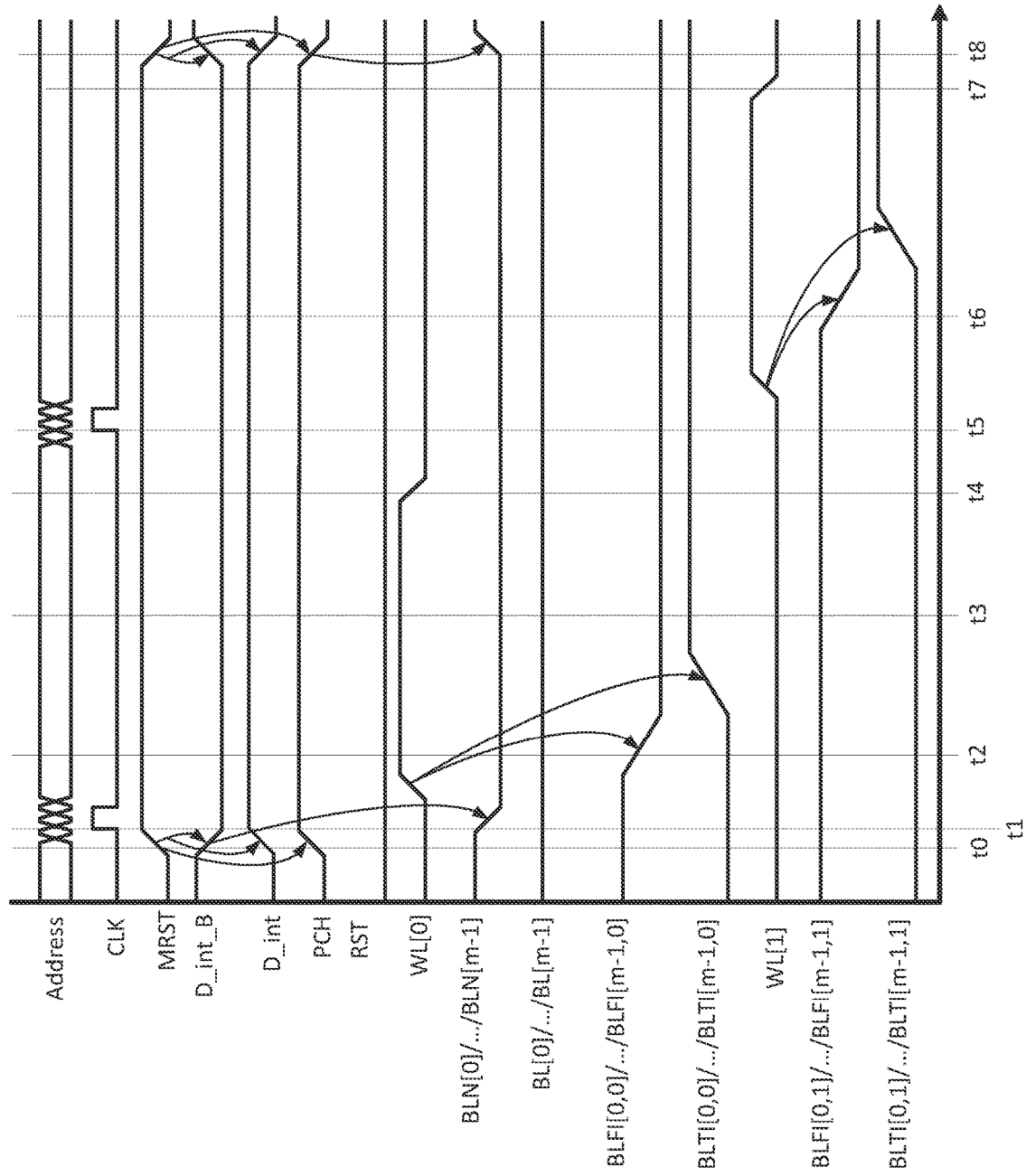
FIG. 10B is a timing diagram of the SRAM device of FIG. 8 when sequentially resetting multiple rows of memory cells to a default value of logic 1.

As shown in FIG. 10B, when RST is at a logic low and MRST is asserted, D_int is forced to a logic 1 and D_int_B is forced to a logic 0. In greater detail, MRST is asserted at time t0, having the effect of releasing precharge on the bit lines BL[0], . . . , BL[m-1] and complementary bit lines BLN[0], . . . , BLN[m-1], and having the effect of setting the multiplexers so that D_int is forced to a logic 1 and D_int_B is forced to a logic 0. At this time, the address, indicating row 0, is decoded by the row decoder 18b. Also, the column decoder 18a selects all columns, indicating that all bit lines BL[0], . . . , BL[m-1] and complementary bit lines BLN[0], . . . , BLN[m-1] are selected.

Then, at time t1, the clock CLK is pulsed, and after the falling edge of the clock, the row decoder 18b asserts the word line WL[0], allowing the states of the memory cells C[0,0], . . . , C[m-1,0] to be flipped to a logic 1 at time t2, meaning that the nodes BLTI[0,0], . . . , BLTI[m-1,0] rise to a logic high and that the nodes BLFI[0,0], . . . , BLFI[m-1,0] fall to a logic low. The states of the memory cells C[0,0], . . . , C[m-1,0] are flipped all at once. At time t3, due to falling low of the nodes BLFI[0,0], . . . , BLFI[m-1,0], the bit lines BL[0], . . . , BL[m-1] remain at a logic high.

At time t4, the row decoder 18b deasserts the word line WL[0]. This completes the reset of the memory cells C[0,0], . . . , C[m-1,0], and then the memory cells C[0,n-1], . . . , C[m-1,n-1] can be reset. Note that at the end of the reset of memory cells C[0,0], . . . , C[m-1,0], MRST is not released (e.g., remains asserted), and PCH is not released (e.g., remains asserted), while no precharge is performed on the bit lines BL[0], . . . , BL[m-1] and complementary bit lines BLN[0], . . . , BLN[m-1].

For the reset of the memory cells C[0,n-1], . . . , C[m-1,n-1], since the states of the bit lines BL[0], . . . , BL[m-1] and complementary bit lines BLN[0], . . . , BLN[m-1] are already as needed to perform a reset, to reset the memory cells C[0,n-1], . . . , C[m-1,n-1], a new address is received, and the address containing row n-1 is decoded by the row decoder 18b. Then, at time t5, the clock CLK is pulsed, and after the falling edge of the clock, the row decoder 18b asserts the word line WL[n-1].

The states of the memory cells C[0,n-1], . . . , C[m-1,n-1] are flipped to a logic 1 at time t6, meaning that the nodes BLTI[0,n-1], . . . , BLTI[m-1,n-1] rise to a logic high and that the nodes BLFI[0,n-1], . . . , BLFI[m-1,n-1] fall to a logic low. After this, the reset of the memory cells C[0,n-1], . . . , C[m-1,n-1] is complete, and the word line WL[n-1] is released at time t7.

Although in the particular examples of FIGS. 10A-10B, the reset of two rows sequentially is described, understand that the above may be repeated to reset as many rows as desired, and those rows need not be sequential (e.g., row 0 may be reset, then row 2 may be reset, then row 4 may be reset, etc). Also understand that although in this particular example all columns of the selected rows are reset, fewer than all columns may be reset—whichever columns are selected by the column decoder 18a are reset through the above operations.

Since the desired reset operation (the reset of rows 0 and n-1) has been performed, at time t8, MRST and PCH are released (e.g., allowed to drop to logic low), so the complementary bit lines BLN[0], . . . , BLN[m-1] rise back high.

Note that through selection using the RST signal, desired patterns can be formed when resetting. For example, certain selected rows can be reset to a logic 0 by the multiplexers 45a and 45b of those rows selecting Vdd, and certain selected rows can be reset to a logic 1 by the multiplexers 45a and 45b of those rows selecting ground. Such patterns may be checkerboard patterns, for example.

F. Fast Reset of Multiple Rows Simultaneously, With Selectable Reset Value

Figure 11:
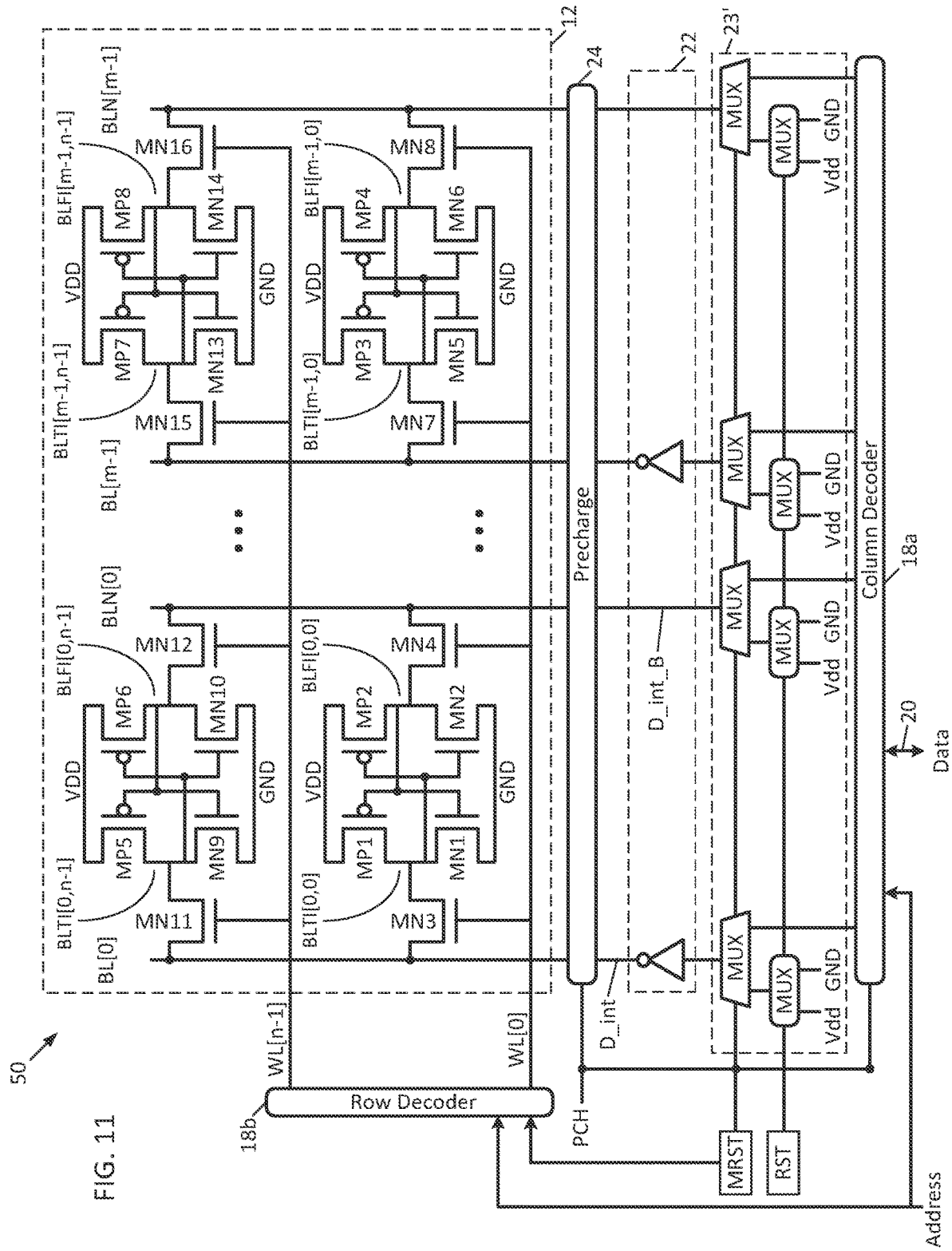
FIG. 11 is a schematic block diagram of a SRAM device disclosed herein which is capable of performing a fast and low-power reset of the memory array to either a default value of a logic 0 or a default value of a logic 1, multiple rows at a time.

The SRAM device 50 shown in FIG. 11 is the same as the SRAM device 30''' of FIG. 8, except here MRST is also coupled to the row decoder 10b. This provides the SRAM device 50 with the functionality of the SRAM device 30' in that it can simultaneously reset multiple rows during a single clock cycle. For example, any number of rows may be reset at the same time (e.g., two rows may be reset at the same time, four rows may be reset at the same time, eight rows may be reset at the same time, etc.). Note here that the strength of the write drivers 22 may be increased to enable the parallelism of multiple rows being reset simultaneously.

Figure 12A:
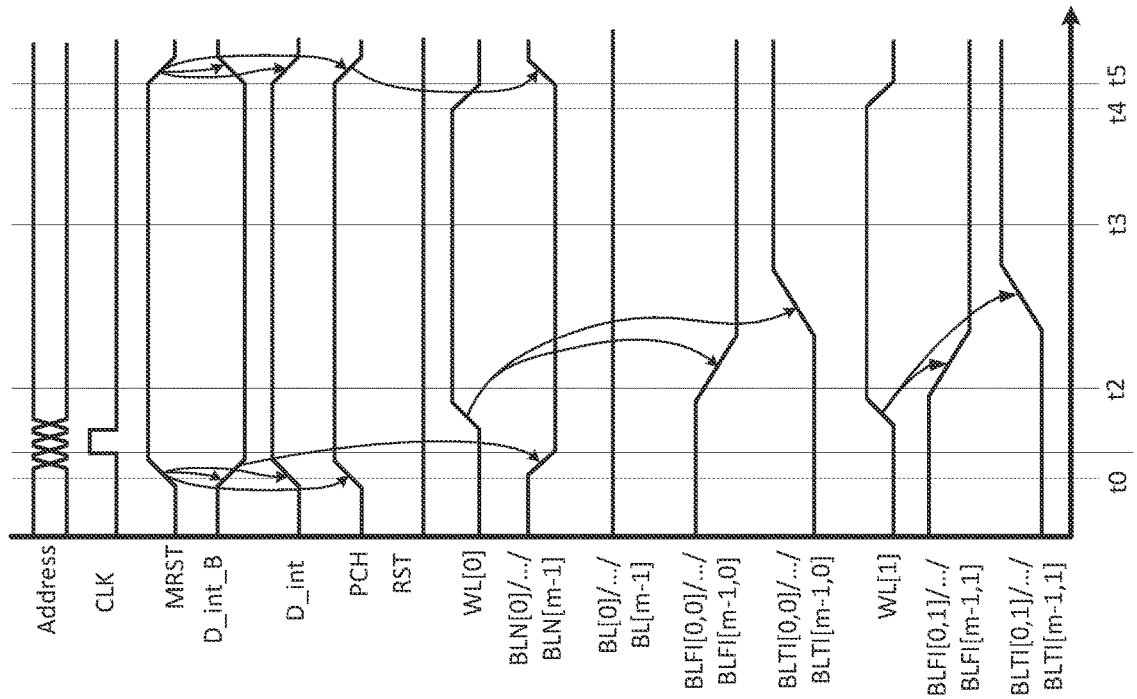
FIG. 12A is a timing diagram of the SRAM device of FIG. 11 when simultaneously resetting multiple rows of memory cells to a default value of logic 0.
Figure 12B:
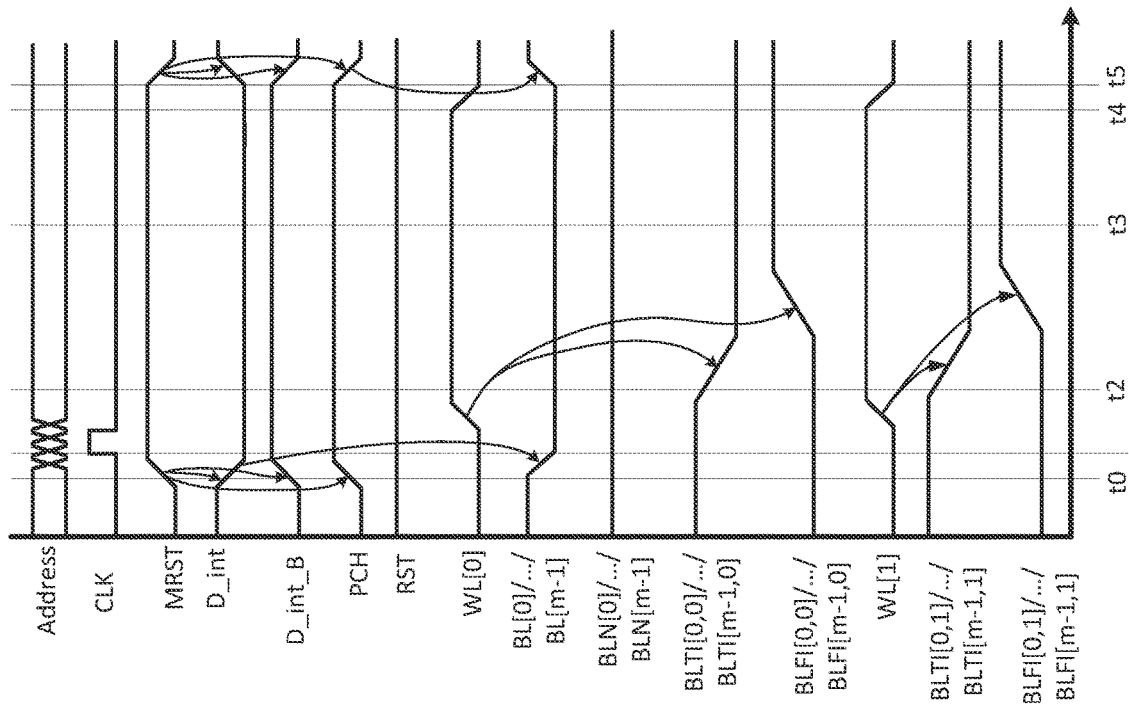
FIG. 12B is a timing diagram of the SRAM device of FIG. 11 when simultaneously resetting multiple rows of memory cells to a default value of logic 1.

With additional reference to FIG. 12A, assume for this example that it is desired to reset rows 0 and n-1 at the same time. MRST operates as described with reference to the SRAM device 30' of FIG. 4, with RST acting to select the values of D_int and D_int_B when the multiplexer 46a receives MRST as being asserted. As shown in FIGS. 12A-12B, the SRAM device 50 operates identically to the SRAM device 30', except that, as stated, the value of RST selects the values of D_int and D_int_B when MRST is asserted. Thus, as shown in FIG. 10A, when RST is at a logic high and MRST is asserted, D_int is forced to a logic 0 and D_int_B is forced to a logic 1, and operation is identical to that described above with reference to FIG. 5.

The operation to reset multiple rows to a logic 1 at the same time is now described with reference to FIG. 12B. MRST is asserted at time t0, having the effect of releasing precharge on the bit lines BL[0], . . . , BL[m-1] and complementary bit lines BLN[0], . . . , BLN[m-1], and having the effect of setting the multiplexers so that D_int is forced to a logic 1 and D_int_B is forced to a logic 0.

Then, at time t1, the clock signal CLK is pulsed, and the row decoder 18b simultaneously asserts the word lines WL[0] and WL[n-1] after the falling edge of CLK as shown, allowing the states of the memory cells C[0,0], . . . , C[m-1,0] and C[0,n-1], C[m-1,n-1] to be flipped to a logic one at time t2, meaning that the nodes BLTI[0,0], . . . , BLTI[m-1,0] and BLTI[0,n-1], . . . , BLTI[m-1,n-1] rise to a logic high and that the nodes BLFI[0,0], . . . , BLFI[m-1,0] and BLFI[0,n-1], . . . , BLFI[m-1,n-1] fall to a logic low. Note that the states of the memory cells C[0,0], . . . , C[m-1,0] and C[0,n-1], . . . , C[m-1,n-1] are flipped all at once. At time t3, due to falling low of the nodes BLFI[0,0], . . . , BLFI[m-1,0], the bit lines BL[0], . . . , BL[m-1] remain at a logic high.

At time t4, the row decoder 18b deasserts the word lines WL[0] and WL[n-1]. This completes the reset of the memory cells C[0,0], . . . , C[m-1,0] and C[0,n-1], . . . , C[m-1,n-1]. Appreciate here that all columns of the rows 0 and n-1 have been reset simultaneously, meaning that it may be helpful to increase the strength of the write drivers 22 to help ensure sufficient capability to reset the memory cells simultaneously to the desired default value.

After this, the reset of the memory cells C[0,n-1], . . . , C[m-1,n-1] is complete, and MRST (and therefore also PCH) is released at time t5. This reinstates precharge, charging the complementary bit lines BLN[0], . . . , BLN[m-1] back high.

G. Use of Counter to Control Row Decoder, With Selectable Reset Value

Figure 13:
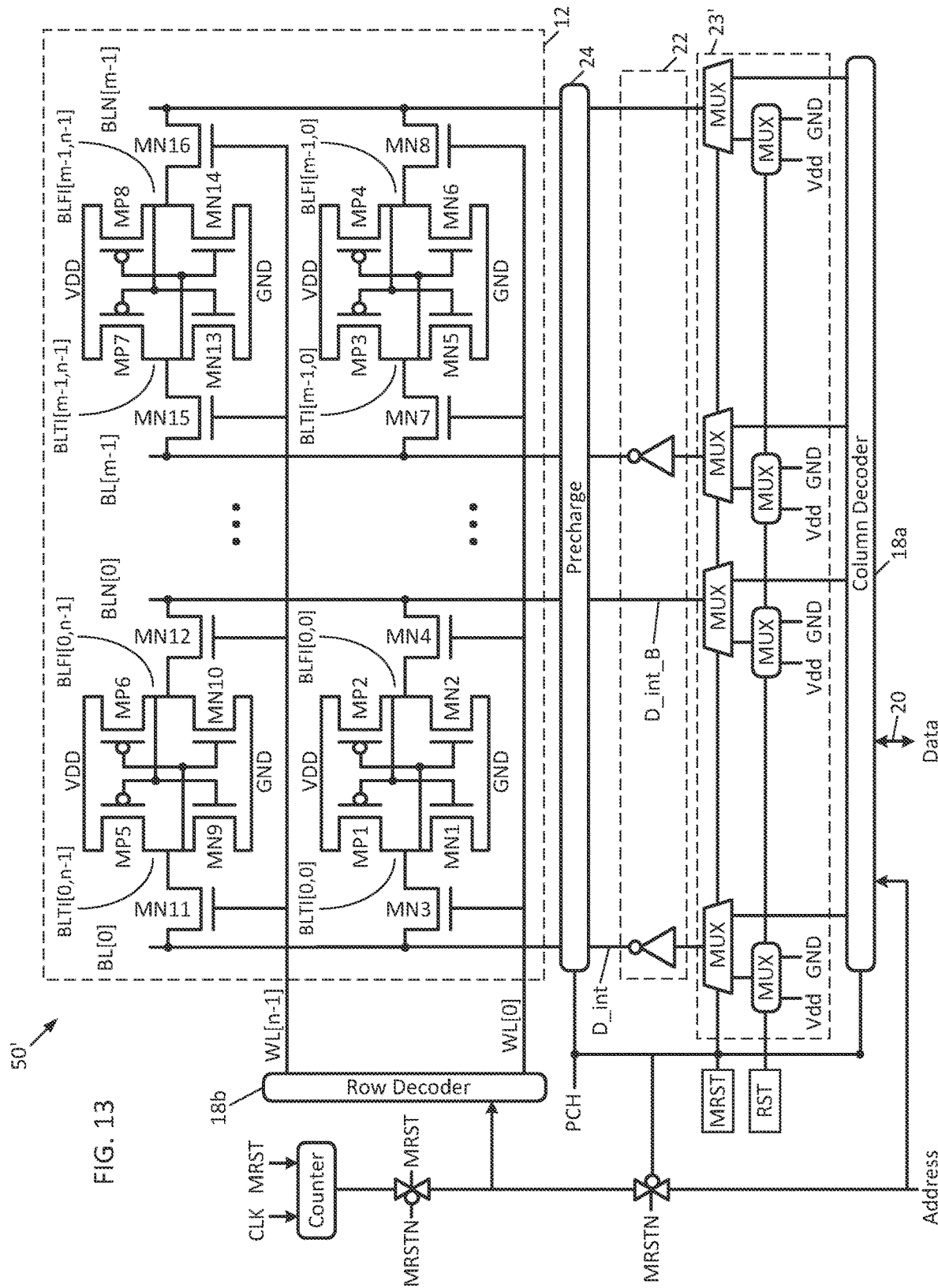
FIG. 13 is a schematic block diagram of a SRAM device disclosed herein which is capable of performing a fast and low-power reset of the memory array to either a default value of a logic 0 or a default value of a logic 1, one row at a time, with a counter controlling the row decoder.

The SRAM device 50' shown in FIG. 13 is the same as the SRAM device 30''' of FIG. 8, except here the SRAM device 50' includes a counter 19 that is clocked by the clock CLK, and is reset by MRST. The counter 19 is selectively coupled to the row decoder 18b by a transmission gate 42, the transmission gate 42 being activated to pass output from the counter 19 to the row decoder 18b when MRST is asserted. Additionally, when MRST is asserted, a transmission gate 41 disconnects the address input from the row decoder 18b, so that the row decoder 18b operates based upon the output from the counter 19.

In operation therefore, the output of the counter 19 determines which word line WL[0], ..., WL[n-1] is asserted by the row decoder 18b. The counter 19 may count from an initial value (e.g., 0) to a final value (e.g., 15) by any increment (e.g., count by 1, count by 2, count by 4, etc.).

Figure 14A:
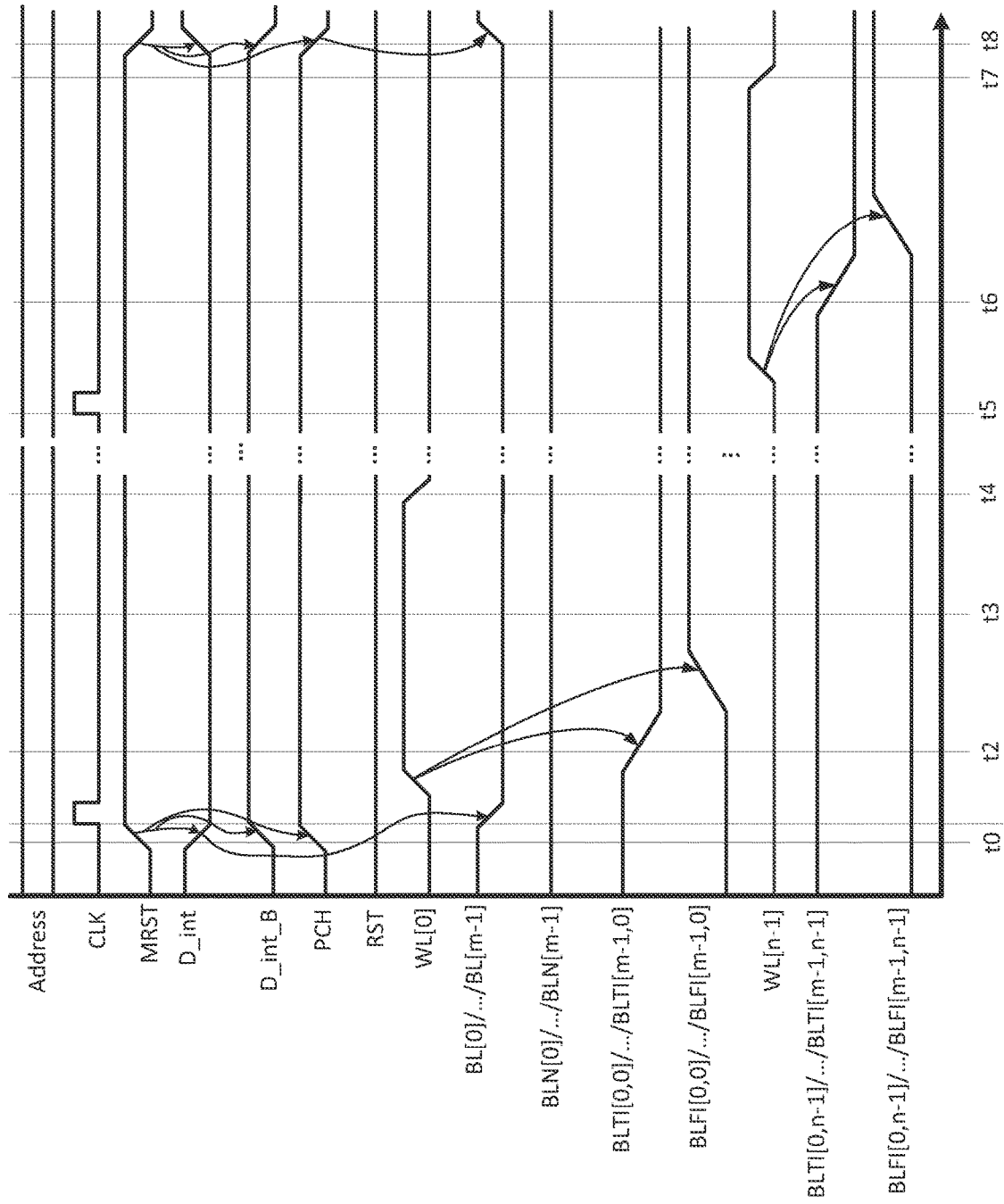
FIG. 14A is a timing diagram of the SRAM device of FIG. 13 when sequentially resetting multiple rows of memory cells to a default value of logic 0.
Figure 14B:
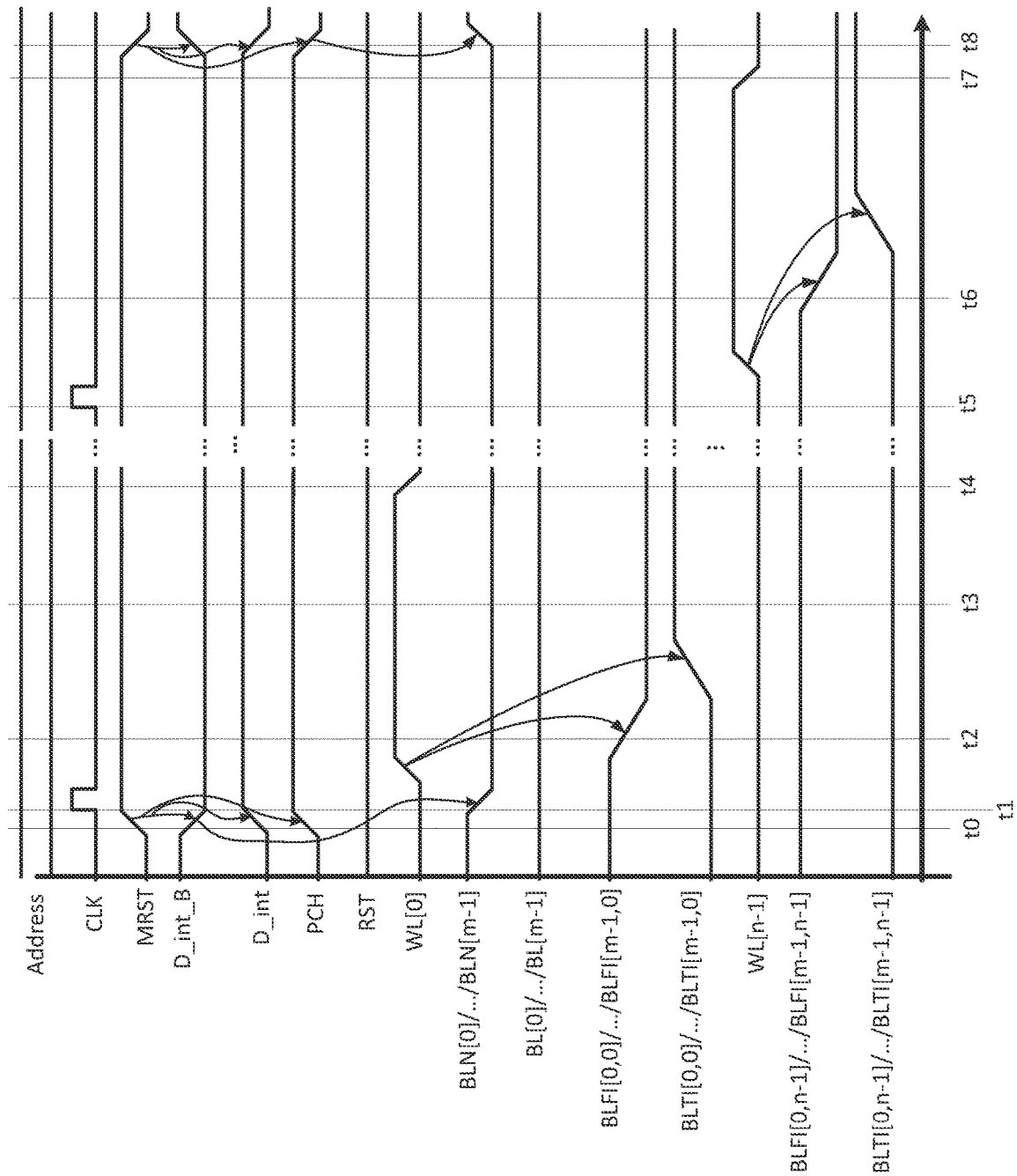
FIG. 14B is a timing diagram of the SRAM device of FIG. 13 when sequentially resetting multiple rows of memory cells to a default value of logic 1.

Operation using the counter 19 is now described with additional reference to FIGS. 14A-14B. As shown in FIGS. 14A-14B, the SRAM device 50' operates identically to the SRAM device 30''', except that, as stated, the value of RST selects the values of D_int and D_int_B when MRST is asserted. Thus, as shown in FIG. 14A, when RST is at a logic high and MRST is asserted, D_int is forced to a logic 0 and D_int_B is forced to a logic 1, and operation is identical to that described above with reference to FIG. 6 to reset a desired number of rows sequentially, with the counter 19 providing the address used by the row decoder 18 in order to assert selected word lines from among WL[0], ..., WL[n-1].

The operation to reset multiple rows to a logic 1 at the same time is now described with reference to FIG. 14B.

Assume that it is desired to reset all rows of memory cells in the memory array 12, here, rows 0 to n-1. To make this happen, MRST is asserted at time t0, having the effect of releasing precharge on the bit lines BL[0], ..., BL[m-1] and complementary bit lines BLN[0], ..., BLN[m-1], and having the effect of setting the multiplexers so that D_int is forced to a logic 1 and D_int_B is forced to a logic 0. Notably here, the assertion of MRST resets the counter 19, opens the transmission gate 42 (causing it to act as a short), and closes the transmission gate 19 (causing it to act as an open circuit). Also, at this time, the column decoder 18a selects all columns, indicating that all bit lines BL[0], ..., BL[m-1] and complementary bit lines BLN[0], ..., BLN[m-1] are selected.

Then, at time t1, the clock CLK is pulsed, and after the falling edge of the clock, the counter 19 begins to count, here at 0, and therefore first outputs a 0 to the row decoder. Also after the falling edge of the clock CLK, the row decoder 18b asserts the word line corresponding to the first output of the counter 19, which here is word line WL[0]. This allows the states of the memory cells C[0,0], ..., C[m-1,0] to be flipped to a logic one at time t2, meaning that the nodes BLTI[0,0], ..., BLTI[m-1,0] rise to a logic high and that the nodes BLFI[0,0], ..., BLFI[m-1,0] fall to a logic low. Note that the states of the memory cells C[0,0], ..., C[m-1,0] are flipped all at once. At time t3, due to falling low of the nodes BLFI[0,0], ..., BLFI[m-1,0], the bit lines BL[0], ..., BL[m-1] remain at a logic high. At time t4, the row decoder 18b deasserts the word line WL[0]. This completes the reset of the memory cells C[0,0], ..., C[m-1,0]. As explained above, at the end of the reset of memory cells C[0,0], ..., C[m-1,0], MRST is not released (e.g., remains asserted), and PCH is not released (e.g., remains asserted), while no precharge is performed on the bit lines BL[0], ..., BL[m-1] and complementary bit lines BLN[0], ..., BLN[m-1].

At time t5, another clock pulse CLK is received, incrementing the counter 19. Assume in this example that rows 2 through n-2 have already been reset by time t5, with one clock pulse CLK being received per row to be reset and with the counter 19 being incremented after each row. At time t5, the clock pulse CLK increments the counter 19 to n-1, which is output to the row decoder 18b.

For the reset of the memory cells C[0,n-1], ..., C[m-1,n-1], since the states of the bit lines BL[0], ..., BL[m-1] and complementary bit lines BLN[0], ..., BLN[m-1] are already as needed to perform a reset, to reset the memory cells C[0,n-1], ..., C[m-1,n-1], after time t5, the row decoder 18b asserts the word line WL[n-1].

The states of the memory cells C[0,n-1], ..., C[m-1,n-1] are flipped to a logic one at time t6, meaning that the nodes BLTI[0,n-1], ..., BLTI[m-1,n-1] rise to a logic high and that the nodes BLFI[0,n-1], ..., BLFI[m-1,n-1] fall to a logic low. After this, the reset of the memory cells C[0,n-1], ..., C[m-1,n-1] is complete, and the word line WL[n-1] is released at time t7. At time t8, MRST is released, having the effect of releasing PCH, and therefore charging the complementary bit lines BLN[0], ..., BLN[m-1] back high.

The techniques described above apply to self-timed SRAM memories as well as non-self timed SRAM memories.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A method of resetting a memory, comprising:
   a) precharging bit lines of a memory array by applying a precharge voltage to the bit lines;
   b) asserting a signal at a reset node to thereby remove the precharge voltage from the bit lines;
   c) selecting write drivers associated with the bit lines associated with columns of the memory array that contain memory cells to be reset;
   wherein the assertion of the signal at the reset node also results in assertion of inputs of the selected write drivers, thereby causing those selected write drivers to change a logic state of the bit lines associated with those write drivers;
   d) asserting a word line associated with a row of the memory that contains memory cells to be reset, thereby writing desired logic states to all of the memory cells of the columns and row of the memory to be reset during a first clock cycle, and then deasserting that word line; and
   e) without first reapplying the precharge voltage to the bit lines, asserting a word line associated with an other row of the memory that contains memory cells to be reset, thereby writing the desired logic states to all of the memory cells of the columns and the other row of the memory to be reset during a second clock cycle, and then deasserting that word line.

2. The method of claim 1, further comprising: f) repeating step e) until each row containing memory cells to be reset has had those memory cells reset; and g) deasserting the signal at the reset node; and h) reapplying the precharge voltage to the bit lines.

3. The memory of claim 1, wherein all columns contain memory cells to be reset; and wherein at c), all write drivers associated with the bit lines are selected.

4. The memory of claim 1, wherein the assertion of the signal at the reset node results in assertion of the inputs of the selected write drivers, thereby causing those selected write drivers to pull the bit lines associated with those write drivers to a logic low; wherein the desired logic states written to all of the memory cells of the columns and the row of the memory to be reset is a logic 0; and wherein the desired logic states written to all of the memory cells of the columns and the other row of the memory to be reset are logic 0s.

5. The memory of claim 1, wherein the assertion of the signal at the reset node results in application of desired logic signals to the inputs of the selected write drivers, thereby causing those selected write drivers to drive the bit lines associated with those drivers to desired logic states; wherein the desired logic states written to all of the memory cells of the columns and the row of the memory to be reset represent a predefined pattern; and wherein the desired logic states written to all of the memory cells of the columns and the other row of the memory to be reset represent the predefined pattern.

6. The memory of claim 1, wherein the assertion of the signal at the reset node results in assertion of the inputs of the selected write drivers, thereby causing those selected write drivers to pull the bit lines associated with those write drivers to a logic high; wherein the desired logic states written to all of the memory cells of the columns and the row of the memory to be reset are logic 11; and wherein the desired logic states written to all of the memory cells of the columns and the other row of the memory to be reset are logic 1s.

7. The method of claim 1, wherein assertion of the word line associated with the row of the memory that contains the memory cells to be reset results in writing a same logic state to all of the memory cells of the columns and row of the memory to be reset during the first clock cycle, and then deasserting that word line.

8. The method of claim 1, further comprising using a counter to determine the rows to be reset; further comprising: f) repeating step e) until each row containing memory cells to be reset has had those memory cells reset, while incrementing the counter after each performance of step e).

9. A method of resetting a memory, comprising:
a) precharging bit lines of a memory array by applying a precharge voltage to the bit lines;
b) asserting a signal at a reset node to thereby remove the precharge voltage from the bit lines;
c) selecting write drivers associated with the bit lines associated with columns of the memory array that contain memory cells to be reset;
wherein the assertion of the signal at the reset node also results in application of desired logic states to inputs of the selected write drivers, thereby causing those selected write drivers to change a logic state of the bit lines associated with those write drivers; and
d) asserting each word line associated with a row of the memory that contains memory cells to be reset, thereby writing the desired logic states to all of the memory cells of the columns and rows of the memory to be reset during a single clock cycle, and then deasserting those word lines.

10. The method of claim 9, further comprising: g) deasserting the signal at the reset node; and h) reapplying the precharge voltage to the bit lines.

11. The memory of claim 9, wherein less than all columns contain memory cells to be reset; and wherein at c), less than all write driver associated with the bit lines are selected.

12. The memory of claim 9, wherein assertion of the signal at the reset node results in assertion of the inputs to the selected write drivers, thereby causing those selected write drivers to pull the bit lines associated with those write drivers to a logic low; and wherein the desired logic states written to all of the memory cells of the columns and rows of the memory to be reset are logic 0s.

13. The memory of claim 9, wherein the assertion of the signal at the reset node results in application of desired logic signals to the inputs of the selected write drivers, thereby causing those selected write drivers to drive the bit lines associated with those drivers to desired logic states; wherein the desired logic states written to all of the memory cells of the columns and the rows of the memory to be reset represent a predefined pattern.

14. The memory of claim 9, wherein assertion of the signal at the reset node results in assertion of the inputs to the selected write drivers, thereby causing those selected write drivers to drive the bit lines associated with those write drivers to a logic high; and wherein the desired logic states written to all of the memory cells of the columns and rows of the memory to be reset are logic 1s.

15. A static random access memory (SRAM) device, comprising:
a memory array being comprised of memory cells and being organized into rows and columns, with each row having a word line associated therewith and each column having a bit line and complementary bit line associated therewith;
a row decoder configured to selectively assert word lines of desired rows;
a column decoder configured to select desired columns;
precharge circuitry associated with the bit lines and complementary bit lines; and
column driving circuitry configured to selectively drive the bit lines and the complementary bit lines of the desired columns to opposite logic states;
wherein, in response to assertion of a reset signal:
the precharge circuitry is configured to release a precharge voltage applied to the bit lines and complementary bit lines;
the row decoder is configured to assert the word lines of each desired row for a given period of time sufficient to permit resetting of the memory cells in that desired row, with the precharge circuitry maintaining the precharge voltage as being released between assertions of the word lines; and
the precharge circuitry is configured to reinstate the precharge voltage after expiration of the given period of time for a last desired row.

16. The SRAM device of claim 15, wherein the row decoder is configured to selectively assert the word lines of desired rows simultaneously.

17. The SRAM device of claim 15, wherein the row decoder is configured to assert the word lines of desired rows sequentially, under control of a counter, with the counter being incremented between assertion of different word lines.

18. The SRAM device of claim 15, wherein the opposite logic states that the bit lines and complementary bit lines are driven to by the column driving circuitry are such that the bit lines are driven to a first logic state and the complementary bit lines are driven to a second logic state.

19. The SRAM device of claim 15, wherein the column driving circuitry comprises:

an inverter associated with each different bit line, that
inverter having its output coupled to that bit line; and
a multiplexing circuit comprising:
- a different first multiplexer respectively associated with each different bit line; and
- a different second multiplexer respectively associated with each different complementary bit line;
- wherein each first multiplexer has a first data input coupled to the reset signal, a second data input coupled to the column decoder, a selection input coupled to the reset signal;
- wherein each second multiplexer has a first data input coupled to a complement of the reset signal, a second data input coupled to the column decoder, a selection input coupled to the reset signal; and
- wherein, in response to assertion of the reset signal, each first multiplexer and each second multiplexer of each selected column passes its first data input as output, thereby driving the bit lines and the complementary bit lines of the desired columns to the opposite logic states.

20. The SRAM device of claim 15, wherein the column driving circuitry comprises:
an inverter associated with each different bit line, that inverter having its output coupled to that bit line; and
a multiplexing circuit comprising:
- a different first multiplexer and first additional multiplexer respectively associated with each different bit line; and
- a different second multiplexer and second additional multiplexer respectively associated with each different complementary bit line;
- wherein each first additional multiplexer has a first data input coupled to a logic high voltage, a second data input coupled to a logic low voltage, a selection input coupled to a logic state selection signal, and an output;
- wherein each first multiplexer has a first data input coupled to the output of the first additional multiplexer, a second data input coupled to the column decoder, a selection input coupled to the reset signal, and an output coupled to the inverter for its respective bit line;
- wherein each second additional multiplexer has a first data input coupled to a logic high voltage, a second data input coupled to a logic low voltage, a selection input coupled to a logic state selection signal, and an output;
- wherein each second multiplexer has a first data input coupled to the output of the first additional multiplexer, a second data input coupled to the column decoder, a selection input coupled to the reset signal, and an output coupled to its respective complementary bit line; and
- wherein, in response to assertion of the reset signal, each first multiplexer and each second multiplexer of each selected column passes its first data input as output, thereby driving the bit lines and the complementary bit lines of the desired columns to the opposite logic states.

* * * * *